United States Patent
Liebchen

(10) Patent No.: US 6,738,859 B2
(45) Date of Patent: May 18, 2004

(54) METHOD AND APPARATUS FOR FAST AERIAL IMAGE SIMULATION

(75) Inventor: Armin Liebchen, Hayward, CA (US)

(73) Assignee: ASML Masktools B.V., Veldhoven (NL)

(*) Notice: Subject to any disclaimer, the term of this patent is extended or adjusted under 35 U.S.C. 154(b) by 325 days.

(21) Appl. No.: 09/948,697

(22) Filed: Sep. 10, 2001

(65) Prior Publication Data

US 2002/0062206 A1 May 23, 2002

Related U.S. Application Data

(60) Provisional application No. 60/231,953, filed on Sep. 12, 2000.

(51) Int. Cl.[7] .................. G06F 17/50; G06F 19/00; G03F 9/00
(52) U.S. Cl. .............. 711/19; 716/21; 703/5; 703/6; 430/5
(58) Field of Search .................. 716/19, 21; 703/5; 430/5; 356/399; 705/5

(56) References Cited

U.S. PATENT DOCUMENTS

| | | | |
|---|---|---|---|
| 5,644,390 A | | 7/1997 | Yasuzato |
| 5,922,513 A | | 7/1999 | Jeon et al. |
| 6,052,626 A | | 4/2000 | Inui |
| 6,171,731 B1 | * | 1/2001 | Medvedeva et al. ........... 430/5 |
| 6,223,139 B1 | * | 4/2001 | Wong et al. .................... 703/5 |
| 2002/0041377 A1 | * | 4/2002 | Hagiwara et al. ........... 356/399 |
| 2003/0103189 A1 | * | 6/2003 | Neureuther et al. ........ 351/176 |

FOREIGN PATENT DOCUMENTS

| EP | 0 965 823 A2 | 12/1999 |
|---|---|---|
| JP | 2000-243690 | 8/2000 |

OTHER PUBLICATIONS

Pati, Y.C. et al "Exploiting Structure in Fast Aerila Image Computation for Integrated Circuit Paterns", IEEE Transactions on Semiconductor Manufacturing, vol. 10, No. 1, Feb. 1997, pp. 62–74.*

Nick Cobb et al., "Fast, Low–Complexity Mask Design", SPIE vol. 2440, pp. 313–326, no date.

Handbook of Epoxy Resin (Published Dec. 25, 1987) (separate English explanation).

* cited by examiner

*Primary Examiner*—Vuthe Siek
*Assistant Examiner*—Magid Y Dimyan
(74) *Attorney, Agent, or Firm*—McDermott, Will & Emery

(57) ABSTRACT

The present invention provides a method and apparatus for simulating an aerial image projected from an optical system, wherein the optical system includes a pupil and a mask. In general, the method comprises the steps of obtaining parameters for the optical system, calculating a kernel based on an orthogonal pupil projection of the parameters of the optical system onto a basis set, obtaining parameters of the mask, calculating a vector based on an orthogonal mask projection of the parameters of the mask onto a basis set, calculating a field intensity distribution using the kernel and the vector, and obtaining aerial image data from the field intensity distribution.

17 Claims, 8 Drawing Sheets

METHOD AND APPARATUS FOR FAST AERIAL IMAGE SIMULATION

This application claims the benefit of provisional application Ser. No. 60/231,953 filed Sep. 12, 2000.

BACKGROUND OF THE INVENTION

In lithography, an exposure energy, such as ultraviolet light that is generated in an optical system, is passed from an aperture of the system through a mask (or reticle) and onto a target such as a silicon substrate. The mask typically may contain opaque and transparent regions formed in a predetermined pattern. The exposure energy exposes the mask pattern, thereby forming an aerial image of the mask. The aerial image is then used to form an image onto a layer of resist formed on the target. The resist is then developed for removing either the exposed portions of resist for a positive resist or the unexposed portions of resist for a negative resist. This forms a patterned substrate. A mask typically may comprise a transparent plate such as fused silica having opaque (chrome) elements on the plate used to define a pattern. A radiation source illuminates the mask according to well-known methods. The radiation transmitted through the mask and exposure tool projection optics forms a diffraction-limited latent image of the mask features on the photoresist. The patterned substrate can then be used in subsequent fabrication processes. In semiconductor manufacturing, such a patterned substrate can be used in deposition, etching, or ion implantation processes, to form integrated circuits having very small features.

In a manufacturing process using a lithographic projection apparatus, a pattern in a mask is imaged onto a substrate, which is at least partially covered by a layer of radiation-sensitive material (resist). Generally, lithographic patterning processes are understood by those who practice the profession. Information regarding exemplary processes may be obtained, for example, from the book "Microchip Fabrication: A Practical Guide to Semiconductor Processing", Third Edition, by Peter van Zant, McGraw Hill Publishing Co., 1997 ISBN 0-07-067250-4.

As the size of lithographically fabricated structures decreases, and the density of the structures increases, the cost and complexity of designing masks additionally increases. One method of reducing costs of lithographic fabrication is by optimizing the lithographic design with a lithographic simulation step prior to the actual manufacturing step. One specific method of lithographic simulation is drawn to simulating the aerial image of the mask. The aerial image is defined as an intensity distribution of light just prior to reaching the resist on a surface of a substrate, when the substrate is exposed via the mask in an exposure apparatus. In order to simulate the aerial image, a layout of a mask and exposure conditions (non-limiting examples include NA: Numerical Aperture, σ (sigma): Partial Coherence Factor) of the lithographic apparatus are typically required as input parameters.

Lithographic apparatus may employ various types of projection radiation, non-limiting examples of which include light, ultra-violet ("UV") radiation (including extreme UV ("EUV"), deep UV ("DUV"), and vacuum UV ("VUV")), X-rays, ion beams or electron beams. The following have been considered exemplary exposure sources. Light may generally refer to certain mercury emissions, i.e., wavelengths of 550 nm for the f-line, 436 nm for the g-line, and 405 mn for the h-line. Near-UV or UV generally typically refer to other mercury emissions, i.e., 365 nm for the i-line. DUV generally refers to excimer laser emissions, such as KrF (248 nm) and ArF (193 nm). VUV may refer to excimer laser $F_2$, i.e., 157 nm, $Ar_2$, i.e., 126 nm, etc. EUV may refer to 10–15 nm. This last portion of the electromagnetic spectrum is very close to "soft X-rays" but has been named as "EUV", possibly to avoid the bad reputation of X-ray patterning. Soft X-rays may refer to 1–15 nm, which may typically be used in X-ray lithography.

Depending on the type of radiation used and the particular design requirements of the apparatus, the projection system may be for example, refractive, reflective or catadioptric, and may comprise vitreous components, grazing-incidence mirrors, selective multi-layer coatings, magnetic and/or electrostatic field lenses, etc; for simplicity, such components may be loosely referred to in this text, either singly or collectively, as a "lens".

When the resist is exposed by the aerial image, there is an additional variable in that some of the exposure light is reflected back by the surface of the substrate, and then absorbed by the resist. Accordingly, not only the resist characteristics (regarding, for example, refractive index: Dill's A,B,C) but also parameters regarding the characteristics of the substrate (e.g., refractive index) should be included as input parameters for simulating the latent image.

The so-called Hopkins model treats the electric field forming the image typically as a scalar and assumes the object being imaged is sufficiently thin so that its effect on the incident field is represented by a multiplicative function. It is advantageous to perform the image formation analysis in the Fourier domain (frequency space) in order to deal with the pupil function of the imaging system rather than the amplitude response function, and with the angular distribution or "effective source" rather than with the mutual intensity.

There are several computer programs commercially available that calculate aerial images based on the Hopkins model. For example, the University of California at Berkeley, Department of Electrical Engineering and Computer Science, Berkeley, Calif., 94720, offers a program called SPLAT.

The Hopkins model is used to model the imaging of drawn design features under partially coherent illumination. A major problem in modeling aerial images under partially coherent illumination is the necessity to superimpose and add the effect of each individual illumination source that makes up the partially coherent source. In the Hopkins model, a two-dimensional by two-dimensional transmission cross-coefficient function ("TCC") is pre-calculated, which captures all the effects of the lithographic projection apparatus, including NA, sigma, etc. As taught, for example in Born & Wolf, p. 603, once a TCC is known, systems with partially coherent illumination can be modeled by integrating the TCC over the Fourier transform of the transmission function for the geometrical layout feature under illumination.

Fundamentally, the TCC is a two-dimensional by two-dimensional correlation function with a continuous set of arguments. In practice, an assumption can be made that the feature patterns to be imaged are periodic in space. For such periodic patterns, the TCC has a large, but discrete, set of arguments. The TCC can then be represented as a matrix, with discrete columns and rows. For typical features interesting to the lithographer the size of this matrix is tremendous and restricts the scale and size of features that can be simulated. It is a purpose of any simulation algorithm based on the Hopkins model to reduce the size of this matrix by approximation, while retaining a reasonable degree of accuracy.

An exemplary projection lithography system is illustrated in FIGS. 1A and 1B. In FIG. 1A, light from illumination source 102 is focussed by condenser 104. The condensed light passes through the mask 106, then through the pupil 108 and onto the substrate 110. As shown in FIG. 1B, substrate 110 may comprise a top anti-reflective coating 112, a resist 118, a bottom anti-reflective coating 117, a top substrate layer 114 and a plurality of other substrate layers. As indicated in FIG. 1B, the focal plane may lie within the resist 118.

In the past, several numerical techniques have been applied to reduce the size of the TCC to reasonable scales. In one instance singular value decomposition has been applied to decompose the TCC into its eigenspectrum, sort the resulting eigenvectors in decreasing magnitude of their eigenvalues, and only retain a finite number of eigenvectors in order to approximate the TCC. An exemplary method for optical simulation for the system of FIG. 1A, that uses the Hopkins model, is illustrated in FIG. 2. As illustrated in FIG. 2, at step S202, the lithographic projection apparatus and mask parameters are input in the system. At step S204, the TCC is approximated by an eigenvector diagonalization. At step S206, a two-dimensional table of convolution integrals of the eigenfunctions with a discrete set of normalized rectangles is calculated and tabulated. The article, "Fast, Low-Complexity Mask Design", by N. Cobb et al., SPIE Vol. 2440, pgs. 313–326, the entire disclosure of which is incorporated by reference, teaches an exemplary method for completing step S206. Since the resulting table is on a discrete grid of possible layout-features, to attain an acceptable resolution, the table must be large. At step S208, since the TCC has been approximated, the illumination system can be modeled, i.e. the aerial image can be simulated by combining each two-dimensional convolution integral corresponding to each respective rectangle in a given proximity window.

This method has two drawbacks. First, an eigenvector diagonalization is a numerically expensive operation. Thus, for a user to change lithographic projection apparatus conditions, such as NA, sigma, illumination type or lens-aberration, an expensive recalculation of the TCC approximation that limits the use of the simulation tool is required. Second, the eigenspectrum of the TCC is a two-dimensional function. Representing the associated field vectors of the geometrical pattern under illumination requires a two-dimensional lookup table that limits the speed of the field calculation in the Hopkins algorithm. Specifically, since the field vectors are a two-dimensional table, two pointers are needed to access any respective address of data, which increases access time. Further, since the field vectors are a two-dimensional table, they are stored in a portion of the cache. Using a look-up table from a DRAM in a present day CPU is more expensive than performing multiplication because the cache miss penalty is larger than the time to perform the multiplication.

Accordingly, there is needed a method and apparatus for simulating a projection lithography system using the Hopkins model, that does not use a numerically expensive eigenvector diagonalization operation. What is further needed is a method and apparatus for simulating a projection lithography system using the Hopkins model that permits a user to change lithographic projection apparatus conditions, such as NA, sigma, illumination type or lens-aberration without requiring an expensive recalculation of the TCC approximation.

BRIEF DESCRIPTION OF THE INVENTION

It is an object of the present invention to provide a method and apparatus for simulating a projection lithography system using the Hopkins model that does not use a numerically expensive eigenvector diagonalization operation.

It is another object of the present invention to provide a method and apparatus for simulating a projection lithography system using the Hopkins model that permits a user to change lithographic projection apparatus conditions without requiring an expensive recalculation of the TCC approximation.

It is still another object of the present invention to provide a method and apparatus for predicting the intensity field distribution ("aerial image") at the surface and throughout the resist film of a substrate being irradiated in a lithographic imaging process.

In accordance with the foregoing objectives, the present invention writes the TCC as $T(q'q)$, where q and q' each are continuous frequencies in two-dimensional Fourier space, $q=(q_x, q_y)$, $q'=(q'_x, q'_y)$. The present invention approximates the TCC extremely well as a bilinear form of a basis function with kernel $A[ij]$. Furthermore, the present invention utilizes a set of orthogonal polynomials. The kernel $A[ij]$ represents a small matrix that efficiently approximates the TCC for a broad range of illumination conditions used in modern lithographic processing. The present invention uses a lower number of arithmetic operations as a result of the use of a one-dimensional look-up table as opposed to the two-dimensional look-up table in the prior art. Furthermore, the one-dimensional look-up table achieves a higher cache hit ratio than a two-dimensional look-up table of the same resolution, thereby providing a more efficient system.

In general, in one embodiment, the invention features a method of simulating an aerial image projected from an optical system, the optical system including a pupil and a mask plane, the method comprising the steps of providing a mask to the mask plane, obtaining parameters for the optical system, calculating a kernel based on an orthogonal pupil projection of the parameters of the optical system onto a basis set, obtaining parameters of the mask, calculating a vector based on an orthogonal mask projection of the parameters of the mask onto a basis set, calculating a field intensity distribution using the kernel and the vector, and obtaining an aerial image from the field intensity distribution.

In one embodiment of the invention, the parameters for the optical system include aberrations.

In another embodiment of the invention, the step of calculating a kernel corresponding to the parameters of the optical system includes the step of generating a table of indefinite integrals based on a recurrence over a seed array of incomplete gamma functions.

In yet another embodiment of the invention, the step of calculating a kernel corresponding to the parameters of the optical system further includes the step of tabulating an array of orthogonal pupil projection coefficients corresponding to respective points in the pupil of the optical system, wherein the optical system is in-focus. More particularly, it further comprises the step of combining sample weights of an illuminator profile of the optical system with the array of orthogonal pupil projection coefficients.

In still another embodiment of the invention, the step of calculating a kernel corresponding to the parameters of the optical system further includes the step of tabulating an array of orthogonal pupil projection coefficients corresponding to respective points in the pupil of the optical system, wherein the optical system is either not in-focus or has aberrations. More particularly, it further comprises the step of combining sample weights of an illuminator profile of the optical system with the array of orthogonal pupil projection coefficients.

In still yet another embodiment of the invention, the step of calculating a kernel corresponding to the parameters of the optical system further includes the step of: tabulating an array of orthogonal pupil projection coefficients corresponding to respective points in the pupil of the optical system, wherein the optical system accounts for effects of diffusion of photoactive compounds in the resist. More particularly, it further comprises the step of combining sample weights of an illuminator profile of the optical system with the array of orthogonal pupil projection coefficients.

In a further embodiment of the invention, the step of calculating a vector corresponding to the parameters of the mask further includes the step of specifying a proximity window within the mask for geometric sampling.

In still a further embodiment of the invention, the step of calculating a vector corresponding to the parameters of the mask further includes the step of decomposing a geometric pattern of the mask into a disjoint set of rectangles and tabulating an array of projections of the rectangles within a proximity window. More particularly, the step of calculating a vector corresponding to the parameters of the mask further includes the step of correcting the array of projections of the rectangles based on the type of mask.

In general, in another aspect, the invention features a method for simulating an aerial image projected from an optical system, the optical system including a pupil and a mask plane, the method comprising the steps of: providing a mask to the mask plane, obtaining parameters for the optical system, obtaining parameters of the mask, projecting the components of electric field vectors to an orthogonal polynomial basis as described in further detail below, the polynomials including polynomials associated with the parameters of the optical system, and approximating the transmission cross-correlation function associated with the optical system based on the orthogonal projection of polynomials.

In general, in still another aspect, the invention features a simulation device operable to simulate an aerial image projected from an optical system, the optical system including a pupil and a mask plane, the simulation device comprising a first parameter obtainer for obtaining parameters of the optical system, a first calculator for calculating a kernel based on an orthogonal pupil projection of the parameters of the optical system onto a basis set, a second parameter obtainer for obtaining parameters of a mask provided to the mask plane, a second calculator for calculating a vector based on an orthogonal mask projection of the parameters of the mask onto a basis set, a third calculator for calculating a field intensity distribution using the kernel and the vector, and an aerial image obtainer for obtaining aerial image data from the field intensity distribution.

In one embodiment of the invention, the first, second, and third calculators are the same calculator.

In another embodiment of the invention, the parameters for the optical system include aberrations.

In yet another embodiment of the invention, the first calculator is operable to generate a table of indefinite integrals based on a fast recurrence over a seed array of incomplete gamma functions.

In still another embodiment of the invention, the first calculator is operable to tabulate an array of orthogonal pupil projection coefficients corresponding to respective points in the pupil of the optical system, wherein the optical system is in-focus.

In still yet another embodiment of the invention, the first calculator is operable to tabulate an array of orthogonal pupil projection coefficients corresponding to respective points in the pupil of the optical system, wherein the optical system is either not in-focus or has aberrations.

In a further embodiment of the invention, the first calculator is operable to tabulate an array of orthogonal pupil projection coefficients corresponding to respective points in the pupil of the optical system, wherein the optical system accounts for effects of photoactive compound diffusion in the resist.

In still a further embodiment of the invention, the second calculator is operable to specify a proximity window within the mask for geometric sampling.

In yet a further embodiment of the invention, the second calculator is operable to decompose a geometric pattern of the mask into a disjoint set of rectangles and tabulate an array of projections of the rectangles within a proximity window. More particularly the second calculator is operable to correct the array of projections of the rectangles based on the type of mask.

In general, in yet another aspect, the invention features a simulation device operable to simulate all aerial image projected from an optical system, the optical system including a pupil and a mask plane, the simulation device comprising a first parameter obtainer for obtaining parameters of the optical system, a second parameter obtainer for obtaining parameters of a mask provided to the mask plane, a first calculator for orthogonally projecting polynomials, the polynomials including polynomials associated with the parameters of the optical system, and a second calculator for approximating the transmission cross-coefficient associated with the optical system based on the orthogonal projection of polynomials.

Additional advantages of the present invention will become apparent to those skilled in the art from the following detailed description of exemplary embodiments of the present invention. The invention itself, together with further objects and advantages, can be better understood by reference to the following detailed description and the accompanying drawings.

BRIEF DESCRIPTION OF THE DRAWINGS

The accompanying drawings, which are incorporated in and form a part of the specification, illustrate embodiments of the present invention and, together with the description, serve to explain the principles of the invention.

In the drawings.

DETAILED DESCRIPTION OF THE INVENTION

In the following description, for the purposes of explanation, numerous specific details are set forth in order to provide a more thorough understanding of the present invention. It will be apparent, however, to one skilled in the art that the present invention may be practiced without these specific details.

The present invention circumvents the above-described problems of the prior art systems by applying a fundamentally different technique for the approximation of the TCC. Specifically, the present invention closely and efficiently approximates the TCC as a bilinear form of a basis function with kernel A[ij].

Figure 4:
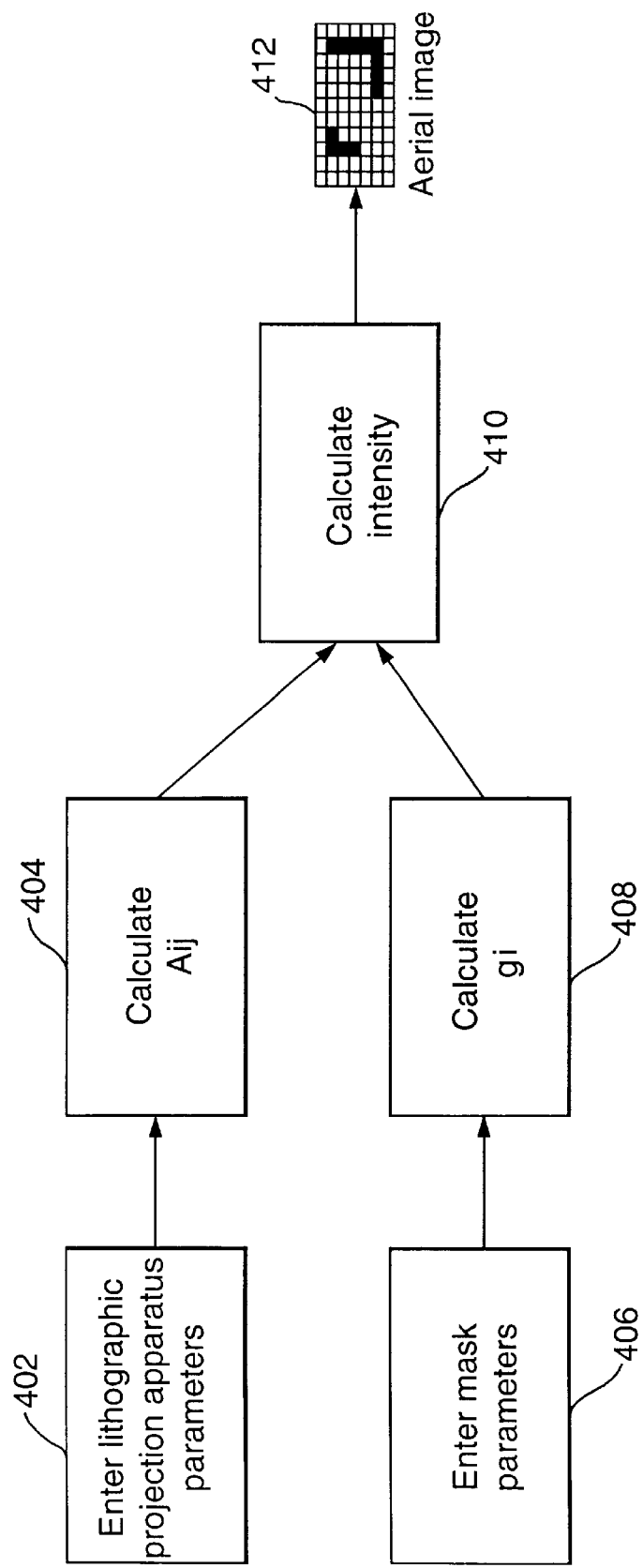
FIG. 4 illustrates the method for simulating an aerial image projected from an optical system in accordance with an exemplary embodiment of the present invention.

A general overview of the operation of the simulation system in accordance with the exemplary embodiment of the present invention is illustrated in FIG. 4. As illustrated in FIG. 4 of the present invention, in step S402, the lithographic projection apparatus parameters are entered. In step S404, a kernel A[ij] is calculated. In step S406, the mask parameters are entered. In step S408, vectors corresponding to mask parameters are calculated. In step S410 the intensity profile of the pupil is calculated using the kernel A[ij] and the vectors corresponding to the mask parameters. In step S412, a simulated aerial image of the mask is produced.

Prior to discussing the operation of a simulation system in accordance with the exemplary embodiment of the present invention in further detail, a brief but concise discussion of the mathematical underpinnings will be provided. Specifically, the spectral basis, including its analytical representation, its basic properties, and its application with regards to an indefinite integral will be discussed. Further, the Fourier transform ("FT") of the basis, including its analytical representation, and its application with regards to an indefinite integral will be discussed. Still further, miscellaneous provisions including orthogonality under a FT will be discussed.

SPECTRAL BASIS

Analytical Representation

A mathematical function provides a mapping of a continuous set of input values to a continuous set of output values. This mapping may be generated in a number of ways. One way is the use of an analytical expression, such as sin(x), or log(x). Another way is by tabulation and interpolation of intermediate values. Yet another way is to represent a function in terms of a linear superposition of a set of known basis functions. For an orthogonal set of basis functions such a representation is called a spectral representation.

The spectral basis considered in the following discussion is represented as:

$$\langle \eta_{[a]} | r \rangle = (\alpha/\sqrt{\pi}) \left(-\frac{1}{2}\right)^{\lambda_a} \exp[\bar{r}^2/2] \partial \frac{a_x}{r_x} \partial \frac{a_y}{r_y} \exp[-\bar{r}^2] \quad (1)$$

which may be factored into one-dimensional contributions. In equation (1), $\bar{r} = \alpha(r - r_0)$ for sampling at a point $r_0$, and $\lambda_a = a_x + a_y$. The one-dimensional basis along the x-dimension follows as:

$$\langle \eta_{[a_x]} | x \rangle = (\alpha/\sqrt{\pi})^{\frac{1}{2}} \left(-\frac{1}{2}\right)^{a_x} \exp[\bar{x}^2/2] \partial \frac{a_x}{r_x} \exp[-\bar{x}^2] \quad (2)$$

Basic Properties
1. Recurrence $$\langle \eta_{[a+1_i]} | r \rangle = \bar{r} \langle \eta_{[a]} | r \rangle - \frac{1}{2} a_i \langle \eta_{[a-1_i]} | r \rangle \quad (3)$$

2. Derivative $$\partial_r \langle \eta_{[a]} | r \rangle = \frac{1}{2} a_i \langle \eta_{[a-1_i]} | r \rangle - \langle \eta_{[a+1_i]} | r \rangle \quad (4)$$

3. Normalization
The basis is orthogonal with normalization constants:

$$(\eta_a(r) \cdot \eta_a(r)) = \frac{a_x! \cdot a_y!}{2^{a_x + a_y}} \quad \text{with } a = (a_x, a_y) \quad (5)$$

Indefinite Integral
The indefinite integral over the spectral basis may be related to an incomplete Gamma function. For Manhattan-style layout designs, the integration boundaries are along the Cartesian coordinate axes and permit a factorization into independent one-dimensional integrations. The following definition of the incomplete Gamma-function $\gamma(\alpha, x)$ is used:

$$\gamma(a, x) := \int_0^x t^{a-1} e^{-t} dt \quad (6)$$

Let $$I_{[a_x]}(x_0, x_1) := \int_{x_0}^{x_1} dx \langle \eta_{[a_x]} | x \rangle \quad (7)$$

Recurrence
Let $x = \alpha \bar{x}$ and $$J_{[a_x, m]}(\bar{x}) := \left(\frac{1}{\alpha \sqrt{\pi}}\right)^{\frac{1}{2}} \left(-\frac{1}{2}\right)^a \int_0^{\bar{x}} dt \, t^m \exp[t^2/2] \partial_t^a \exp[-t^2] \quad (8)$$

Note that $$J_{[a_x, m]}(-\bar{x}) = (-1)^{m+a} J_{[a_x, m]}(\bar{x}).$$

The above integral may then be evaluated as $$I_{[a]}(x_0, x_1) = J_{[a, 0]}(\bar{x}_1) - J_{[a, 0]}(\bar{x}_0) \quad (9)$$

-continued $$J_{[a+1,m]} = \frac{1}{2}\left[J_{[a_x,m+1]} + mJ_{[a_x,m-1]} - \frac{\bar{x}^m}{\alpha}\langle\eta_{[a_x]}|x\rangle + \delta_{m,0}\frac{1}{\alpha}\langle\eta_{[a_x]}|0\rangle\right] \quad (10)$$

$$J_{[0,m]} = \left(\frac{2^{m-1}}{\alpha\sqrt{\pi}}\right)^{\frac{1}{2}}\gamma\left(\frac{m+1}{2},\frac{\bar{x}^2}{2}\right) \quad (11)$$

The Fourier transform of the spectral basis may be expressed as:

$$\langle\eta_{[a]}|\bar{q}\rangle = \frac{1}{\alpha\sqrt{\pi}}\left(\frac{i}{2}\right)^{\lambda_a}\exp[\bar{q}^2/2]\partial\frac{a_x}{q_x}\partial\frac{a_y}{q_y}\exp[-\bar{q}^2] \quad (12)$$

Indefinite Integral

Similar to equation (3), the indefinite integral over the FT of the spectral basis may also be related to an incomplete Gamma function. Due to the circular aperture of the pupil however the two-dimensional integration cannot be simply factorized into one-dimensional products. The present invention uses a hybrid approach, whereby the one-dimensional integration along one axis, for example the x-axis, is performed analytically similar to equation (3). On the other hand, the integration along the other axis, for example the y-axis, is performed numerically. The following considers the one-dimensional analytical integration of the FT of the spectral basis. Let $$I_{[a]}^k(k_0,k_1) := \int_{k_0}^{k_1} dq\langle\eta_{[a]}|q\rangle \quad (13)$$

$$= \alpha\int_{\frac{k_0}{\alpha}}^{\frac{k_1}{\alpha}} d\bar{q}\langle\eta_{[a]}|q\rangle \quad (14)$$

$$= \alpha\int_0^{\bar{k}_1} d\bar{q}\langle\eta_{[a]}|q\rangle - \alpha\int_0^{\bar{k}_0} d\bar{q}\langle\eta_{[a]}|q\rangle \quad (15)$$

Recurrence

Let $\bar{k}=k/\alpha$ and $$J_{[a,m]}^k(k) := \left(\frac{\alpha}{\sqrt{\pi}}\right)^{\frac{1}{2}}\left(\frac{i}{2}\right)^a\int_0^{\bar{k}} dt\, t^m\exp[t^2/2]\partial_t^a\exp[-t^2] \quad (16)$$

then the above integral may be evaluated as $$I_{[a]}^k(k_0,k_1) = J_{[a,0]}^k(k_1) - J_{[a,0]}^k(k_0) \quad (17)$$

A recurrence for $J_{[\alpha,m]}^k(k)$ follows via $$J_{[a+1,m]}^k := \left(\frac{\alpha}{\sqrt{\pi}}\right)^{\frac{1}{2}}\left(\frac{i}{2}\right)^{a+1}\int_0^{\bar{k}} dt\,(t)^m\exp[t^2/2]\partial_t\partial_t^a\exp[-t^2] \quad (18)$$

as:

$$J_{[a+1,m]}^k = \quad (19)$$

$$(-i)\frac{1}{2}[J_{[a,m+1]}^k + mJ_{[a,m-1]}^k - \beta\bar{k}^m\langle\eta_{[a]}|k\rangle + \delta_{m,0}\beta\langle\eta_{[a]}|0\rangle]$$

This relation is identical to equation (10), with $\beta=1/\alpha$ and an additional factor of $(-i)$ per recurrence step.

Initialization

The above seed-elements $$J_{[0,m]}^k$$

are similar to the previous section and may be evaluated similar to equation (11):

$$J_{[0,m]}^k = \left(\frac{2^{m-1}\alpha}{\sqrt{\pi}}\right)^{\frac{1}{2}}\gamma\left(\frac{m+1}{2},\frac{\bar{k}^2}{2}\right) = \alpha J_{[0,m]} \quad (20)$$

With the above refreshing review, the operation of a simulation system in accordance with the exemplary embodiment of the present invention will now be provided in further detail. Table 1, below, provides notations for symbols and their respective descriptions that are used throughout the description of the present invention.

| Symbol | Description |
|---|---|
| r = (x, y) | 2-D position vector fixed z-plane |
| k = ($k_x$, $k_y$) | 2-D wave vector fixed z-plane |
| $\phi_{[s]}^{m,i}$ | plane wave entering mask |
| $\phi_{[D]}^{m,x}$ | scalar field at mask exit plane at normal incidence, $\vartheta = 0$ |
| $\phi_{[s]}^{p,i}$ | scalar field at pupil entrance plane, general incidence angle |
| $\phi_{[s]}^{p,x}$ | scalar field at pupil exit plane, general incidence angle |
| $\phi_{[s]}^{p,i}$ | scalar field at wafer entrance plane, general incidence angle |
| T | Mask transfer matrix |
| P | Pupil transfer matrix |
| M | Magnification factor (0.2, 0.25, etc) |
| $\hat{r}_w$ | Scaled coordinate system at wafer plane |
| $\hat{s}$ | Scaled coordinate system at pupil plane |
| σ | Partial Coherence |

The following discussion uses Dirac notation for a basis-independent representation of field vectors. In this notation, scalar fields in their dual spaces are written as $\langle\phi|$, $|\phi\rangle$. The following are useful identities:

$$\langle\phi|r\rangle = \phi(r) \quad (21)$$

$$\langle\phi|k\rangle = \phi(k) \quad (22)$$

$$\langle r|k\rangle = \frac{1}{2\pi}e^{-ikr} \quad (23)$$

$$\langle k|r\rangle = \langle r|k\rangle* \quad (24)$$

$$\langle r|k\rangle* = \langle r|-k\rangle \quad (25)$$

$$\langle r|k-k'\rangle = \langle k'|r\rangle\langle r|k\rangle \quad (26)$$

Completeness of an orthogonal normalized basis $\xi$ implies $$\int d\xi|\xi\rangle\langle\xi| = 1 \quad (27)$$

Spectral expansions used in the following satisfy the above completeness relation.

Lens Model

When modeling a lens, monochromatic illumination at wavelength λ is assumed. In the following the refractive index in vacuum $\eta_i = 1$ is assumed. The wave-vector may be defined as:

$$k_0 := \frac{2\pi}{\lambda} \quad (28)$$

Further, the apertures may be defined as (w=substrate, s=Source):

$$NA_w = n_i \sin \alpha_w \approx \sin \alpha_w \quad (29)$$

$$NA_s = n_i \sin \alpha_s \approx \sin \alpha_s \quad (30)$$

$$\sigma := \frac{NA_s}{NA_w} \quad (31)$$

The maximum wave-vector transmitted by a pupil of aperture NA thus follows as $$k^{NA} = d_1 \sin \alpha_w = d_1 NA \quad (32)$$

Figure 1A:
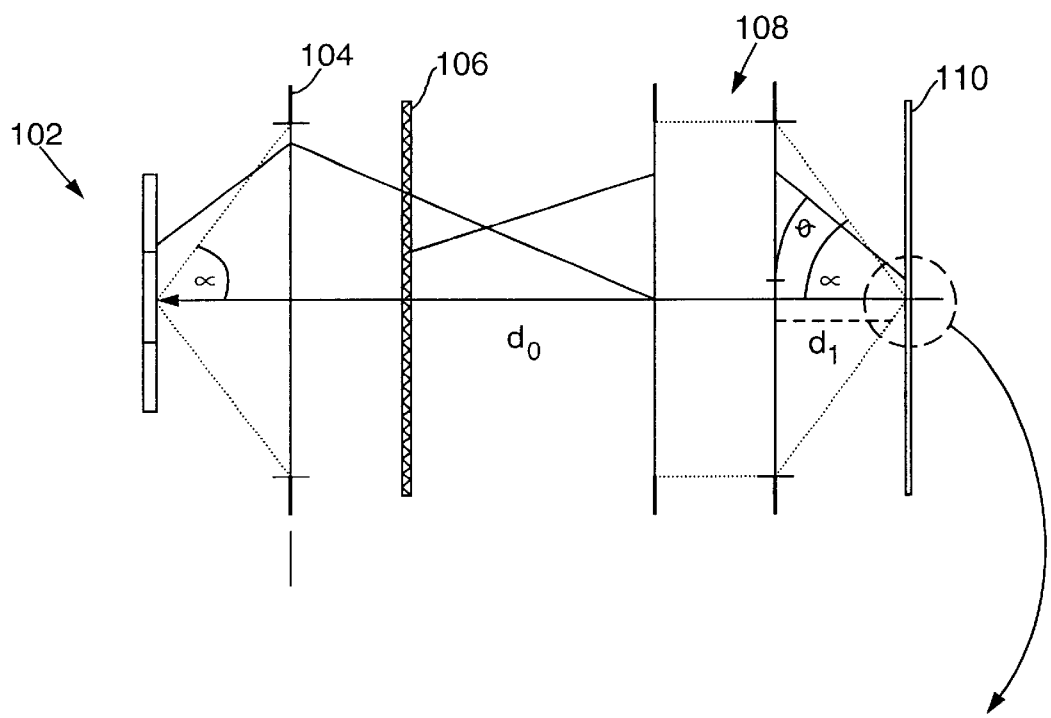
FIGS. 1A and 1B illustrate a conventional optical lithographic system.
Figure 1B:
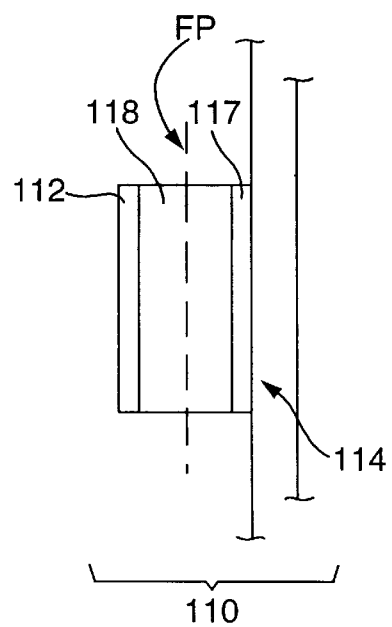
Figure 2:
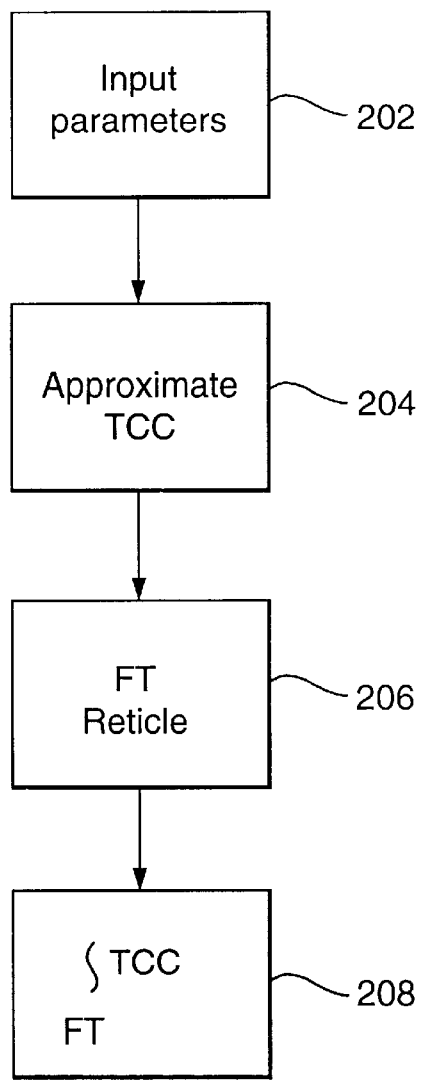
FIG. 2 illustrates a conventional method for simulating an aerial image projected from an optical system.

A magnification factor M may be defined as the ratio of the back-vs. the front-focal length of the objective lens:

$$M := \frac{d_1}{d_0} \quad (33)$$

where $d_0$ and $d_1$ correspond to the focal lengths identified in FIG. 1A. The substrate plane $d_1$ may be adjusted such that it lies in the focal plane of the lens, thereby providing:

$$\frac{1}{f} = \frac{1}{d_0} + \frac{1}{d_1} \quad (34)$$

The mathematical model is expressed in terms of coordinates $k_s$, $r$, $k$, $r_w$. The numerical model however utilizes re-scaled coordinates indicated by "hat" notation. The scaled coordinates relate to the normalized coordinates via $$\hat{r}_m := -Mr_m \text{Mask plane} \quad (35)$$

$$\hat{s}_p := k_0 \sin\vartheta = \frac{k_0}{d_1} s_p \quad \text{Pupil plane} \quad (36)$$

$$k^{\hat{N}A} = k_0 NA \quad (37)$$

$$\hat{s}_s := -\frac{k_s}{M} = -\frac{k_0 \sin\theta_s}{M} \quad \text{Source plane} \quad (38)$$

The current lens model in accordance with the present invention assumes $d_s = d_0$.

Diffractive Elements and Lenses

The propagation of light from the exit plane of a diffraction element, such as for example a mask, $\langle \phi^x | r \rangle$ to a subsequent input plane $\langle \phi^i | k \rangle$ at distance $d_z$ may be expressed in terms of the free-space Greens function of the Helmoholtz equation $\langle \underline{r} | G | \underline{r}' \rangle$ ($\underline{r} = (x,y,z)$ in three dimensions) as $$\langle \underline{r} | \phi^i \rangle = i k_0 \int d\underline{r}' \langle \underline{r} | G | \underline{r}' \rangle \langle \underline{r}' | \phi^x \rangle = i k_0 \langle \underline{r} | G | \phi^x \rangle \quad (39)$$

with $$\langle \underline{r} | G | \underline{r}' \rangle = \frac{e^{-ik_0 |\underline{r} - \underline{r}'|}}{4\pi |\underline{r} - \underline{r}'|} \quad (40)$$

Let z and z' be on fixed planes separated by a distance $d_i$ and $r = (x,y)$ a two-dimensional position vector on each respective plane. A two dimensional approximation follows via $$k_0 |\underline{r} - \underline{r}'| b = k_0 \sqrt{d_i^2 + (r-r')^2} \quad (41)$$

Assume a far-field approximation $|r-r'| \ll d_i$ and approximate by keeping to first order of a Taylor expansion $$k_0 |\underline{r} - \underline{r}'| \simeq k_0 d_i \left[ 1 + \frac{1}{2} \left( \frac{r-r'}{d_i} \right)^2 \right] \quad (42)$$

The first term yields an irrelevant constant phase shift and will be ignored in the following. The two-dimensional field propagator in the far-field regime then follows as $$\langle r | G | r' \rangle = \frac{e^{-i\frac{k_0}{2d_i}(r-r')^2}}{4\pi d_i} \quad (43)$$

Lens Element

The propagation of light from the input plane to the exit plane of a lens element may be expressed in terms of the lens propagator L as $$\langle r | \phi^i \rangle = \int dr' \langle r | L | r' \rangle \langle r' | \phi^x \rangle = \langle r | L | \phi^x \rangle \quad (44)$$

where the lens-propagator in the paraxial approximation may be expressed as:

$$\langle r | L | r' \rangle \simeq e^{i\frac{k_0}{2f}r^2} \delta(r - r') P'(r) \quad (45)$$

Returning back to FIG. 4, the simulation method of the present invention may be implemented using any processor or dedicated circuit that is operable to manipulate data. Non-limiting examples include programmable logic arrays, microprocessors used in conjunction with a memory, or computers. Step S402 may be performed by any device operable to input lithographic projection apparatus parameters. Non-limiting examples include stepper/scanners, mask inspection tools, and external memories containing the appropriate data. Step S406 may be performed by any device operable to input the mask parameters. Similar to step S402, non-limiting examples include stepper/scanners, mask inspection tools, and external memories containing the appropriate data. Further, a single device may be used to input both the lithographic projection apparatus parameters of step S402 and the mask parameters of step S406. Still further, steps S402 and S406 may be performed at the same time. Similarly, steps S404 and S408 may be performed at the same time.

Figure 5:
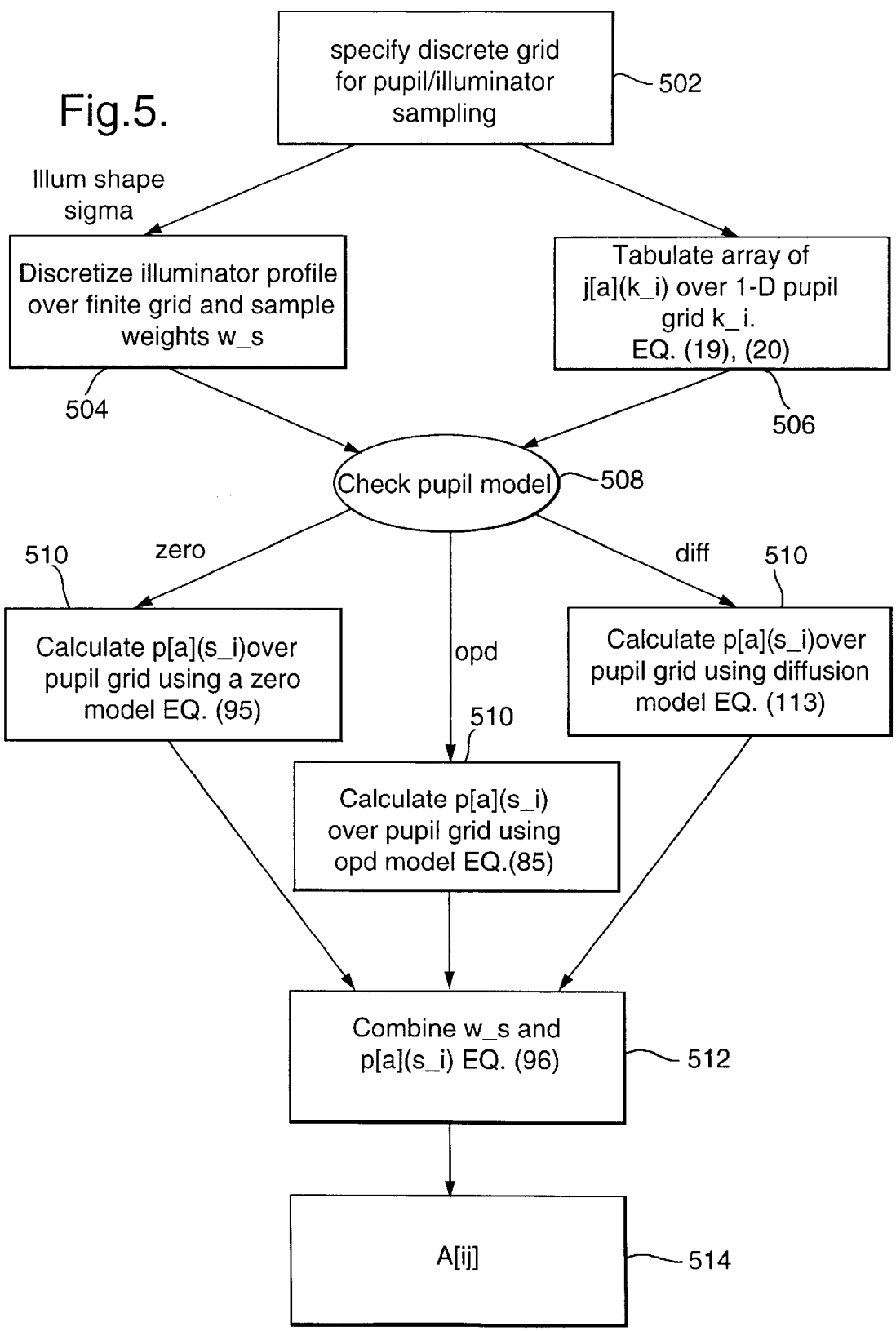
FIG. 5 illustrates an exemplary method for generating a kernel in accordance with the present invention.

Step S404 will now be further described with respect to FIG. 5. At step S502, an area of the pupil of the illuminator is sampled and broken up into a discrete grid. At step S504, the illumination profile of each discrete point corresponding to the sample area is determined, and given a numerical weight according to the relative intensity of the source at the sampled location. At step S506, an array of seed-elements for the semi-indefinite integrals calculated in equation (16)

of each discrete point within a pupil grid corresponding to the sample area is tabulated. Each seed-element is an incomplete gamma function $J_{[0,m]}$, such as is described above with respect to equation (19) and equation (20). At step S508, the pupil model is determined for the simulation method. If the pupil model is for a zero defocus pupil, i.e., for a lens having no aberration, is perfectly in focus, and/or has no phase distortion in the pupil plane, then step $S510_{zero}$ may be performed. If the pupil model has optical path differences, has aberrations, is not perfectly in focus, and/or has phase distortion in the pupil plane, then step $S510_{opd}$ may be performed. Further, if the pupil model accounts for diffusion of the photoactive compound in the resist after image exposure, then step $S510_{diff}$ may be performed. In each one of steps $S510_{zero}$, $S510_{opd}$, and $S510_{diff}$, an array in 'i', shifted by $s_i$, of $p_a(s_i)$ is calculated, wherein each entry is the value of orthogonal projection of the pupil onto the basis set indexed by 'a'. At step S512, the weights of each respective discrete point in the illuminator profile from step S504 are combined with the corresponding orthogonal projection on the basis set as calculated in any one of steps $S510_{zero}$, $S510_{opd}$, and $S510_{diff}$. The solution to the combination performed at step S512 renders the kernel A[ij] at step S514.

The imaging of a simulation system in accordance with the exemplary embodiment of the present invention will now be described with respect to coherent imaging, incoherent imaging with the Hopkins model, and with respect to the basis set decomposition.

COHERENT IMAGING

Pupil Plane

The field at the mask exit plane $$\phi_{[s]}^{m,x}$$

is given as the modulation of the incident field $$\phi_{[s]}^{m,i}$$

by the mask transfer matrix T. For an infinitesimally thin mask layer, T is effectively diagonal (For a basis that satisfies $\langle r|-\eta\rangle = \langle \eta|r\rangle$ a diagonal matrix $\langle r|T|r\rangle$ implies that $\langle \eta|T|\eta'\rangle = f(\eta-\eta')$):

$$\langle \phi_{[s]}^{m,x} | r \rangle = \int dr' \langle \phi_{[s]}^{m,i} | r'\rangle \langle r'|T|r\rangle \delta(r, r') = \langle \phi_{[s]}^{m,i}|T|r\rangle \qquad (46)$$

The field at the pupil entrance plane follows via equation (39) as $$\langle \phi_{[s]}^{p,i} | s_p \rangle = ik_0 \langle \phi_{[s]}^{m,x}|G^0|s_p\rangle \qquad (47)$$

$$= ik_0 \langle \phi_{[s]}^{m,i}|TG^0|s_p\rangle \qquad (48)$$

Substrate Plane

The propagated image at the substrate plane follows according to equation (44) as the field propagated through vacuum segment 1 from the pupil-plane exit field $$\phi_{[s]}^{p,x}:$$

$$\langle \phi_{[s]}^{w,i} | r_w \rangle = ik_0 \langle \phi_{[s]}^{p,x}|G^1|r_w\rangle \qquad (49)$$

The pupil-plane exit field itself is the pupil plane entrance field $\phi_{[s]}^{p,i}$ propagated by the lens transfer matrix $\langle k|L^1|k'\rangle$. The substrate plane field thus follows as $$\langle \phi_{[s]}^{w,i} | r_w \rangle = ik_0 \langle \phi_{[s]}^{p,i}|L^1 G^1|r_w\rangle \qquad (50)$$

The lens transfer matrix is assumed to be diagonal in Fourier space, $\langle k|L^1|k'\rangle = \langle k|L^1|k\rangle \delta(k,k')$. Using equation (47) the substrate plane field may be expressed as a function of the field at the mask input plane as $$\langle \phi_{[s]}^{w,i} | r_w \rangle = -k_0^2 \langle \phi_{[s]}^{m,i}|TG^0 L^1 G^1|r_w\rangle \qquad (51)$$

Source Plane

Coherent imaging assumes a plane wave incident at the mask at incidence angle $\vartheta_s$. Illumination at this angle is equivalent to illumination at normal incidence with a phase modulation of the mask plane amplitude by $k_s = k_0 \sin \vartheta_s = k_0 \hat{s}_s$. The scalar field at the mask exit plane for arbitrary incidence angle can thus be expressed in terms of normal incidence as:

$$\langle \phi_{[s]}^{m,i} | r \rangle = \langle \phi_{[0]}^{m,i} | r \rangle e^{ik_s r} \qquad (52)$$

Under Köhler illumination the field $$\langle \phi_{[0]}^{m,i} | r \rangle$$

reflects a plane wave of normal incidence. The imaginary part of such a plane wave is a globally uniform phase factor and may be factored out. What remains is the real part of $$\langle \phi_{[0]}^{m,i} | r \rangle$$

reflecting the weight of the originating source point in the illumination aperture:

$$\langle \phi_{[0]}^{m,i} | r \rangle = w(\vartheta_s), \qquad (53)$$

Using the above illumination, the substrate plane field for point source located at $k_s$ then follows as:

$$\langle \phi_{[s]}^{w,i} | r_w \rangle = -w(\vartheta_s) k_0^2 \int dr_m e^{ik_s r_m} \langle r_m|TG^0 L^1 G^1|r_w\rangle \qquad (54)$$

Fraunhofer approximation

The above model expresses a Fresnel approximation of the lens system and is non-linear. Several approximations follow to linearize the above imaging system. Expanding equation (54) into its spectral components yields $$\langle \phi_{[s]}^{w,i} | r_w \rangle = \qquad (55)$$
$$-w(\vartheta_s) k_0^2 \int dr_m ds_p e^{ik_s r_m} \langle r_m|T|r_m\rangle \langle r_m|G^0|s_p\rangle \langle s_p|L^1|s_p\rangle \langle s_p|G^1|r_w\rangle$$

-continued $$= -\frac{w(\partial_s)k_0^2}{(4\pi)^2 d_0 d_1} \int dr_m ds_p \exp[ik_s r_m]\langle r_m|T|r_m\rangle P'(s_p) \quad (56)$$

$$\times \exp\left[-ik_0\left(\frac{(r_m - s_p)^2}{2d_0} - \frac{s_p^2}{2f_1} + \frac{(s_p - r_w)^2}{2d_1}\right)\right] \quad (57)$$

The argument of the exponential may be evaluated via:

$$\ln A = ik_0 s_p\left(\frac{r_m}{d_0} + \frac{r_w}{d_1}\right) - ik_0 \frac{s_p^2}{2}\left(\frac{1}{d_0} + \frac{1}{d_1} - \frac{1}{f}\right) - ik_0 \frac{1}{2}\left(\frac{r_m^2}{d_0} + \frac{r_w^2}{d_1}\right) \quad (58)$$

In the last term, the sub-term associated with $$k_0 \frac{r_w^2}{2d_1}$$

will fall out when squaring the field to obtain the intensity of the field at the substrate plane. Under the assumption that the image at the substrate plane approximately mirrors the image at the mask plane, $r_w \sim -Mr_m$, the sub-term $$k_0 \frac{r_m^2}{2d_0}$$

can be eliminated for the same argument.

Defocus Term

The center term in the above described exponential relates to the focus condition of the system. For a perfectly focused system, this term disappears according to equation (34). For a system under small defocus of magnitude $\zeta$, a Taylor expansion yields:

$$\frac{1}{d_1 + \zeta} \cong \frac{1}{d_1} - \frac{1}{d_1^2}\zeta \quad (59)$$

wherein a phase term accounting for defocus thus follows as:

$$\phi^{def} = k_0 \frac{s_p^2}{2d_1^2}\zeta \quad (60)$$

A more accurate defocus model follows by calculating the true optical path difference ("OPD") of the Gaussian reference sphere:

$$\phi^{def}(\zeta) = k_0\zeta(1 - \sigma_x) \quad (61)$$

$$= \zeta\sqrt{k_0^2 - \hat{s}_p^2} \quad (62)$$

Rest of Terms

The first term in equation (58) contains the main imaging information and corresponds to a Fourier transformation of the system. Introducing the scaled coordinates equation (35) this term follows as:

$$X = ik_0 s_p\left(\frac{r_w}{d_1} + \frac{r_m}{d_0}\right) \quad (63)$$

-continued $$= ik_0 s_p\left(\frac{r_w}{d_1} - \frac{\hat{r}_m}{d_1}\right) \quad (64)$$

$$= i\hat{s}_p(r_w - \hat{r}_m) \quad (65)$$

Defining $$P(s_p) := P'(s_p)\exp\left[\frac{ik_0 s_p^2}{2d_1^2}\right]\zeta = P'(s_p)\exp\left[\frac{i\hat{s}_p^2}{2k_0}\right]\zeta \quad (66)$$

the lens system equation (55) then follows as $$\langle \phi_{[s]}^{w,i} | r_w \rangle = \quad (67)$$

$$-\frac{w(\partial_s)k_0^2}{d_0 d_1} \int dr_m ds_p ds'_p \exp[ik_s r_m]\langle r_m|T|r_m\rangle\langle \hat{r}_m|\hat{s}'_p\rangle\langle s'_p|P|s_p\rangle$$

$$\langle \hat{s}_p|r_w\rangle\delta(s_p - s'_p)$$

Define $\langle \hat{r}_m|\hat{T}|\hat{r}_m\rangle := \langle r_m|T|r_m\rangle$, (68)

$$\langle \hat{s}_p|\hat{P}|\hat{s}_p\rangle := \langle s_p|P|s_p\rangle, \text{ then } \langle \phi_{[s]}^{w,i}|r_w\rangle = w(\partial_s)\langle \hat{s}_s|\hat{T}\hat{P}|r_w\rangle$$

INCOHERENT IMAGING: HOPKINS MODEL

In the following, the "hat" notation is dropped and scaled coordinates according to equation (35) are assumed throughout. For incoherent imaging the intensity at the substrate plane follows as a weighted summation over all independent point sources $\hat{s}_s$:

$$I(r_w) = \int dk_s |\langle \phi_{[s]}^{w,i} | r_w \rangle|^2 \quad (69)$$

$$= \int dk_s \langle r_w|PT|\hat{s}_s\rangle w(\hat{s}_s)^2 \langle \hat{s}_s|TP|r_w\rangle \quad (70)$$

$$= \int dk_s \langle r_w|P|k'\rangle\langle k'|T|\hat{s}_s\rangle w(\hat{s}_s)^2 \langle \hat{s}_s|T|k\rangle\langle k|P|r_w\rangle dk dk' \quad (71)$$

Let $$t(k'-k)=\langle k'|T|k\rangle q'=k'-\hat{s}_s, q=k-\hat{s}_s \quad (72)$$

then $$I(r_w)=\int dq dq' dk_s \langle r_w|P|q'+\hat{s}_s, 901\ t(q')w(\hat{s}_s)^2 t^*(q)\langle q+\hat{s}_s|P|r_w\rangle \quad (73)$$

$$=\int dq dq' t(q')t^*(q)\int dk_s \langle r_w|P|q'+\hat{s}_s\rangle w\ (\hat{s}_s)^2\langle q+\hat{s}_s|P|r_w z, 901 \quad (74)$$

since $\langle\langle k'|P|k\rangle$ is diagonal define $P(k):=\langle k|P|k\rangle$:

$$I(r_w)=\int dq dq' t(q')t^*(q)\int dk_s \langle r_w|q'+\hat{s}_s\rangle P^*(q'+\hat{s}_s)w(\hat{s}_s)^2\langle q+\hat{s}_s\rangle \quad (75)$$

$$=\int dq dq' t(q')t^*(q)\langle r_w|q'-q\rangle\int dk_s P^*(q'+\hat{s}_s)w(\hat{s}_s)^2 P(q+\hat{s}_s) \quad (76)$$

Define the Transmission Cross Coefficient (TCC) function $T(q',q)$ $$T(q',q)=\int dk_s P^*(q'+\hat{s}_s)w(\hat{s}_s)^2 P(q+\hat{s}_s) \quad (77)$$

then $$I(r_w)=\int dq dq'\langle r_w|q'\rangle t(q')C(q',q)t^*(q)\langle q|r_w\rangle \quad (78)$$

Assume a factorization exists such that $$T(q', q) = \sum_{ij} \eta_i^*(q')A_{ij}\eta_j(q) \tag{79}$$

where $\eta_i(q)$ forms an orthogonal basis. Combine equation (77) and equation (79):

$$\sum_{ij} \eta_i^*(q')A_{ij}\eta_j(q) = \int dk_s P^*(q'+\hat{s}_s)w(\hat{s}_s)^2 P(q+\hat{s}_s) \tag{80}$$

Let $N_i=(\eta_i,\eta_i)$ be $L^2$-norm of $\eta_i$. Left- and right multiply equation (80) with the orthogonal basis $\eta_{ij}$ followed by an integration over the arguments:

$$A_{ij} = \frac{1}{N_i N_j} \int dq\, dq'\, dk_s \eta_i(q')P^*(q'+\hat{s}_s)w(\hat{s}_s)^2 P(q+\hat{s}_s)\eta_j^*(q) \tag{81}$$

An orthogonal pupil projection coefficient $p_i(k)$ may then be defined as:

$$P_i(\vec{k}) := \frac{1}{N_i} \int d\vec{q}\, P(\vec{q}+\vec{k})\eta_i^*(\vec{q}) \tag{82}$$

$$\frac{1}{N_i} \int d\vec{q}'\, P(\vec{q}')\eta_i^*(\vec{q}'-\vec{k}) \tag{83}$$

In accordance with the present invention, $p_i(k)$ may be pre-calculated for any possible pupil configuration, i.e., considering non-limiting parameters such as NA, focus, aberration, etc. The radial part of the P(k) is typically a circular aperture. The phase part describes aberrations of the lens field.

Using the orthogonal pupil projection, the coefficient matrix, or kernel, $A_{ij}$ of equation (82) follows as:

$$A_{ij} = \int dkw(k)p_i^*(k)p_j(k) \tag{84}$$

Note that $A_{ij}$ is Hermitean.

Figure 7:
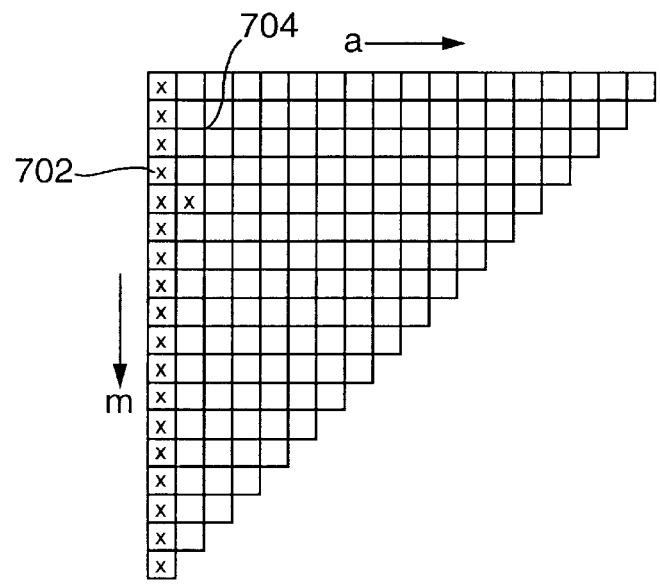
FIG. 7 illustrates an exemplary method for generating a table of indefinite integrals based on a fast recurrence over a seed array of incomplete gamma functions in accordance with the present invention.

Step S506 may be performed in accordance with above-described equations (20) and (19), and as illustrated with respect to FIG. 7. In a first step S702, the column a=0 is initialized in accordance with equations (11) or (20), wherein each entry in the column is seeded with an incomplete gamma function. In the next step S704, the values of column a=0 are propagated to the column to the right in accordance with equations (10) or (19), wherein each entry in the column is filled according to recurrence. After repeating step S704 until row m=0 is fall, the resulting indefinite integrals, values for $J[a](k_i)$ or $J[a](x_i)$, may be determined. As such, the present invention generates a table of indefinite integrals based on a recurrence over a seed array of incomplete gamma functions.

Steps S508–S514 will now be described in more detail.

Algorithms: Aerial Image a. Pupil

Combining equation (82) and equation (66), the orthogonal pupil projection coefficient follows as $$p_a(\hat{s}_s) = \frac{1}{N_i} \int d\hat{q} P'(\hat{q})\exp\left[i\frac{\hat{q}^2}{2k_0}\varsigma\right]\eta_a^*(\hat{q}-\hat{s}_s) \tag{85}$$

Approximation 1: Aberration Model

An aberration model is obtained by modulating the phase distortion over the pupil opening. Normalize the pupil coordinates with respect to NA=1:

$$f := \frac{\hat{q}}{k_0} \tag{86}$$

using $Z_4=2f^2-1$ the phase error K caused by defocus can be expressed as:

$$\Phi_4(f,\varsigma) := \frac{\hat{q}^2}{2k_0}\varsigma = \frac{1}{4}k_0\varsigma(Z_4+Z_1) \tag{87}$$

The constant phase term $Z_1$ may be ignored. Higher order terms of the phase error may be loaded externally from a lens aberration map via a coefficient set $\alpha_n$. ($\Phi_n:=a_n Z_n$). Define $$\Phi(f,\varsigma) := \sum_{i=4}^{N} \Phi_i \tag{88}$$

The orthogonal pupil projection coefficient then follows by numerical integration of $$p_a(\hat{s}_s, \varsigma) = \frac{1}{N_i} \int_0^{\cdot} d\hat{q}\exp[i\Phi(f,\varsigma)]\eta_a^*(\hat{q}-\hat{s}_s) \tag{89}$$

For terms that have only radial dependence (q:=|$\hat{q}$|) the integration may be simplified as:

$$p_a(\hat{s}_s, \varsigma) = \frac{1}{N_i} \int_0^{k^{NA}} q\, dq\exp[i\Phi(f,\varsigma)] \int_0^{2\pi} d\phi\eta_a^*(\hat{q}-\hat{s}_s) \tag{90}$$

Approximation 2: Zero Defocus

For lenses without aberrations, the pupil function is one over the domain of the aperture and zero outside. The pupil aperture may then be expressed as a finite circular integration:

$$p_a(\hat{s}_s, \varsigma) = \frac{1}{N_i} \int_0^{\cdot} d\hat{q}\exp\left[i\frac{\hat{q}^2}{2k_0}\varsigma\right]\eta_a^*(\hat{q}-\hat{s}_s) \tag{91}$$

For a lens system that is in-focus ($\varsigma$=0) equation (85) reduces to a convolution of the pupil aperture with the spectral basis and $p_i^0(\hat{q}_i, \hat{s}_s)$ $$p_a(\hat{s}_s) = \frac{1}{N_i} \int_0^{\cdot} d\hat{q}\eta_a^*(\hat{q}-\hat{s}_s) \tag{92}$$

Figure 3:
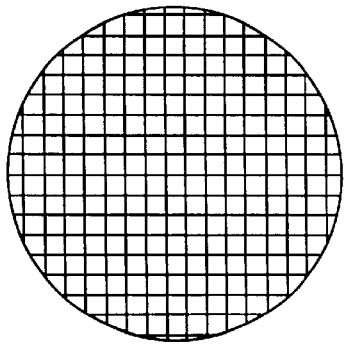
FIG. 3 illustrates a conventional method for dividing a pupil area into a discrete areas.
Figure 10:
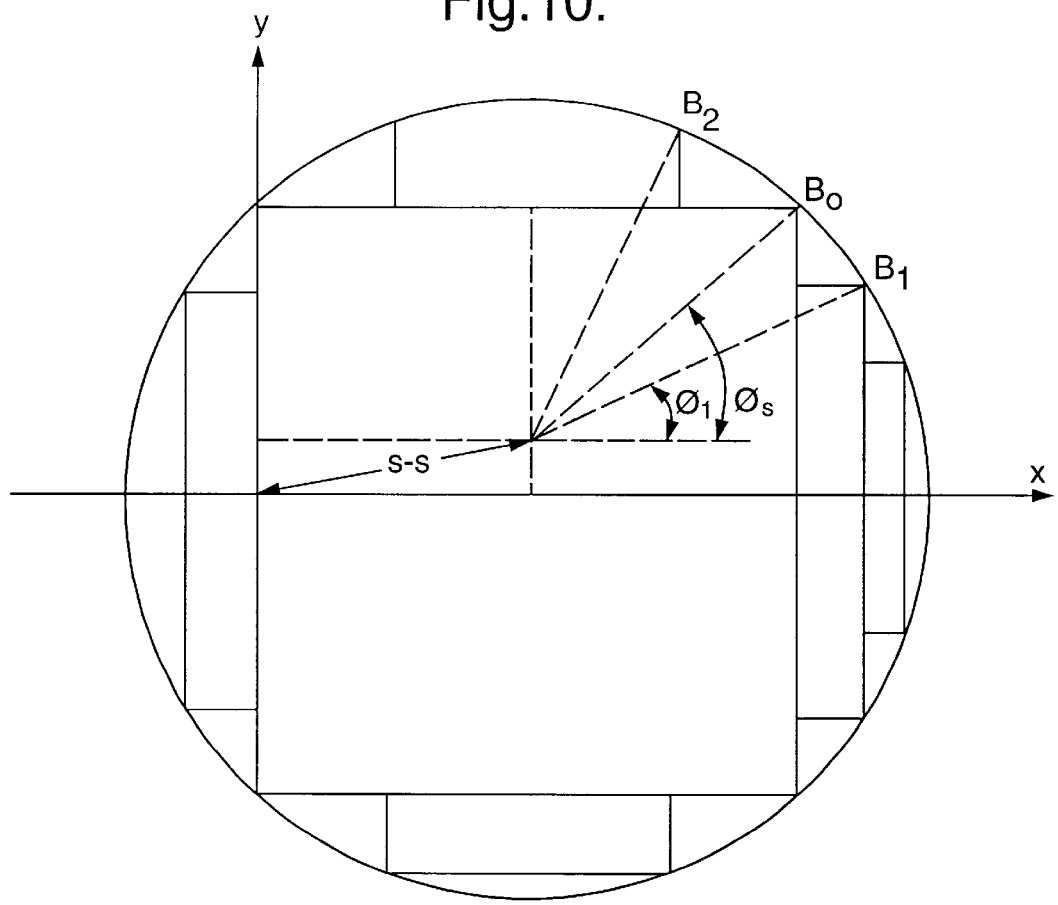
FIG. 10 illustrates an efficient algorithm in accordance with the present invention.

The circular aperture may be approximated by a superposition of rectangular domains $\beta$, as illustrated in FIG. 3. FIG. 10, on the other hand, illustrates the improved method of the present invention, wherein for each domain $\beta$, the pupil convolution evaluates to $$p_a^B(\hat{s}_s) = p_{a_x}^{B_x}(\hat{s}_{s,x})p_{a_y}^{B_y}(\hat{s}_{s,y}) \tag{93}$$

$$p_{a_x}^{B_x}(\hat{s}_{s,x}) = \frac{1}{Na_x}\int_{b_{x0}}^{b_{x1}} d\hat{q}_x \eta^{1D^*} a_x(\hat{q}_x-\hat{s}_{s,x}) \tag{94}$$

An efficient method for evaluating the above one-dimensional integral, will now be described with respect to FIG. 11.

From equation (17) the zero defocus case may be expressed as $$p_\alpha(\hat{s}_s) = I_{\alpha_x}{}^k(dq_x{}^0, dq_x{}^1) \cdot I_{\alpha_y}{}^k(dq_y{}^0, dq_y{}^1) \quad (95)$$

Sampling over a finite grid $k_s$, a finite approximation to $A_{ij}$ follows as:

$$A_{ij} = \Delta^2 \hat{s}_s \sum_s w(\hat{s}_s) p_i^*(\hat{s}_s) p_j(\hat{s}_s) \quad (96)$$

Figure 11A:
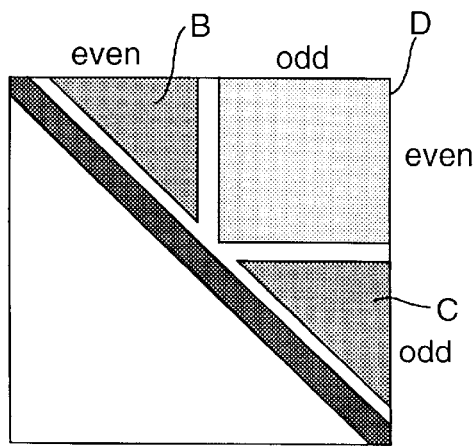
FIG. 11A illustrates the coefficient matrix $A_{ij}$ in accordance with the present invention.
Figure 11B:
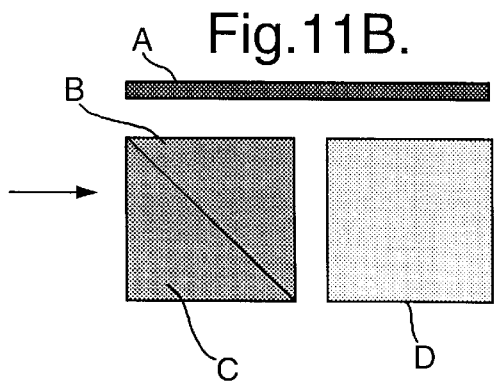
FIG. 11B illustrates an exemplary representation of the coefficient matrix $A_{ij}$ in accordance with the present invention.

Note that $\eta_i^*(k)$, and thus $p_i{}^0(\hat{s}_s)$, are purely real for even indices and purely imaginary for odd indices. The image amplitude is evaluated using only the terms $2\mathrm{Re}\{A_{ij}\}$. Thus, for in-focus conditions all entries in $A_{ij}$ that are purely imaginary may be disregarded, as illustrated in FIG. 11A, as sub-block 'D'. The remaining diagonal A and sub-blocks B and C may be organized in software as illustrated in FIG. 11B.

Approximation 3: First Order Defocus

A first order approximation towards defocus aberration follows by calculating a series expansion of $Pa(\hat{s}_s)$ around $\zeta=0$ up to the first order term:

$$p_a(\hat{s}_s, \varsigma) \simeq p_a(\hat{s}_s, 0) + \varsigma \frac{\partial p_a(\hat{s}_s, \varsigma)}{\partial \varsigma}\bigg|_{\varsigma=0} \quad (97)$$

The first term is given in equation (95). The second term may be evaluated as:

$$\partial_\varsigma p_a(\hat{s}_s, \varsigma) = \frac{i}{2k_0 N_i} \int_0 d\hat{q}\, \hat{q}^2 \exp\left[i\frac{\hat{q}^2}{2k_0}\varsigma\right]\eta_a^*(\hat{q}-\hat{s}_s) \quad (98)$$

For $\zeta=0$ this term follows as:

$$\partial_\varsigma p_a(\hat{s}_s, \varsigma=0) = \frac{i}{2k_0 N_i}\int_o d\hat{q}\,\hat{q}^2 \eta_a^*(\hat{q}-\hat{s}_s) \quad (99)$$

A first and second order correction to the image kernel follow as $$A_{ij}^{(1)} = \Delta^2 \hat{s}_s \sum_s w(\hat{s}_s)[P_i^*(\hat{s}_s)\partial_\zeta P_j(\hat{s}_s) + (\partial_\zeta P_i^*(\hat{s}_s))P_j(\hat{s}_s)] \quad (100)$$

$$A_{ij}^{(2)} = \Delta^2 \hat{s}_s \sum_s w(\hat{s}_s)\partial_\zeta p_i^*(\hat{s}_s)\partial_\zeta p_j^*(\hat{s}_s) \quad (101)$$

Note that $A_{ij}^{(1)}$ is Hermitean with even-even and odd-odd elements purely imaginary entries while $A_{ij}^{(2)}$ is Hermitean with even-odd elements purely imaginary. Calculation of the image intensity yields a bilinear form with a coherent vector $g$. For binary, as well as 180° phase shift masks, all entries $g_i \in g$ are real. For $A_{ij}^{(1)}$ thus only the even-odd and odd-even elements are of relevance while for $A_{ij}^{(2)}$ only the even-even and odd-odd elements contribute to the image intensity.

The first order correction to the image intensity then takes the form:

$$I(r,\zeta) \simeq \sum_{nm} \langle r|g_n\rangle A_{nm}\langle g_m|r\rangle + \langle r|g_n\rangle A_{nm}^{(1+2)}\langle g_m|r\rangle \zeta \quad (102)$$

The first order defocus model can be utilized to rapidly calculate a number of image planes throughout the thickness of the resist profile. As long as the focus deviation over the resist thickness is small (comparing the phase distortion in the outer pupil ring vs $2\pi$), the first order approximation gives a sufficiently accurate model of the defocus behavior through a resist film of finite thickness.

Algorithm 4: Improved OPD integration scheme

For a general solution of equation (91), the following steps may be used:

1. Discretize the domain of the pupil over a finite grid with indices $k_x$, $k_y$, $s_x$, $s_y$.
2. Build a matrix of OPD values in the pupil plane $M_P(k_x, k_y, \zeta) := \mathrm{circ}(k)\exp[i\Phi(k_x, k_y, \zeta)]$
3. Build vector of basis function values in first dimension: $A(a_x, q_x) := \eta^*_{a_x} a(q_x)$
4. Calculate the following vector:

$$C(k_x, a_y)[s_y] = \sum_{k_y} M_P(k_x, k_y, \zeta) A(k_y - s_y, a_y) \quad (103)$$

5. Use the above matrix of vectors to combine all calculations in the second dimension:

$$Pa(s_x, s_y, a_x, a_y) = \frac{1}{N_i}\sum_{k_a} A(k_x - s_x, a_x) C(k_x, a_y)[s_y] \quad (104)$$

Incoherent Imaging: Hopkins Model with Diffusion

In the discussion immediately below, the Hopkins model is modified to include the effects of photoactive compound diffusion in the resist. An isotropic Gaussian diffusion model is assumed. Diffusion is modeled as convolution with a Gaussian kernel:

$$\langle r|Z^2|r'\rangle := \frac{1}{2\pi\sigma^2} e^{-\frac{(r-r')^2}{2\sigma^2}} \quad (105)$$

with $$\sigma = \sqrt{2Dt} \quad (106)$$

Assuming the photoactive compound concentration is linear in $I(r)$, diffusion may be approximated by replacing equation (73) with:

$$\langle r_\omega| \to \langle r_\omega|Z \quad (107)$$

Comparing the above to equation (70), this is equivalent to substitute $$P \to ZP \quad (108)$$

The intensity in equation (74) then follows as:

$$I(r_w) = \int dq dq' t(q') t^*(q) \int dk_s \langle r_w|ZP|q' + \hat{s}_s\rangle w(\hat{s}_s)^2 \langle q + \hat{s}_s|PZ|r_w\rangle \quad (109)$$

The bracketed term inside evaluates to:

$$\langle r_w|ZP|q'+\hat{s}_s\rangle = \int dk dk' \langle r_w|k\rangle\langle k|Z|k'\rangle\langle k'|P|q'+\hat{s}_s\rangle \quad (110)$$

$$= \int dk \langle r_w|k\rangle\langle k|Z|q'+\hat{s}_s\rangle P(q'+\hat{s}_s) \quad (111)$$

If $\langle r|Z|r'\rangle = f(r-r')$, then z is diagonal in k-space. Thus:

$$\langle r_w|ZP|q'+\hat{s}_s\rangle = \langle r_w|q'+\hat{s}_s\rangle Z(q'+\hat{s}_s)P(q'+\hat{s}_s) \quad (112)$$

Therefore, diffusion can be modeled by including the Fourier transform of the Gaussian kernel equation (105) into the calculation of the orthogonal pupil projection coefficient (c.f. equation (82)):

$$P_i(\vec{k}) = \frac{1}{N_i}\int d\vec{q}\, Z(\vec{q}+\vec{k})P(\vec{q}+\vec{k})\eta_i^*(\vec{q}) \quad (113)$$

Figure 6:
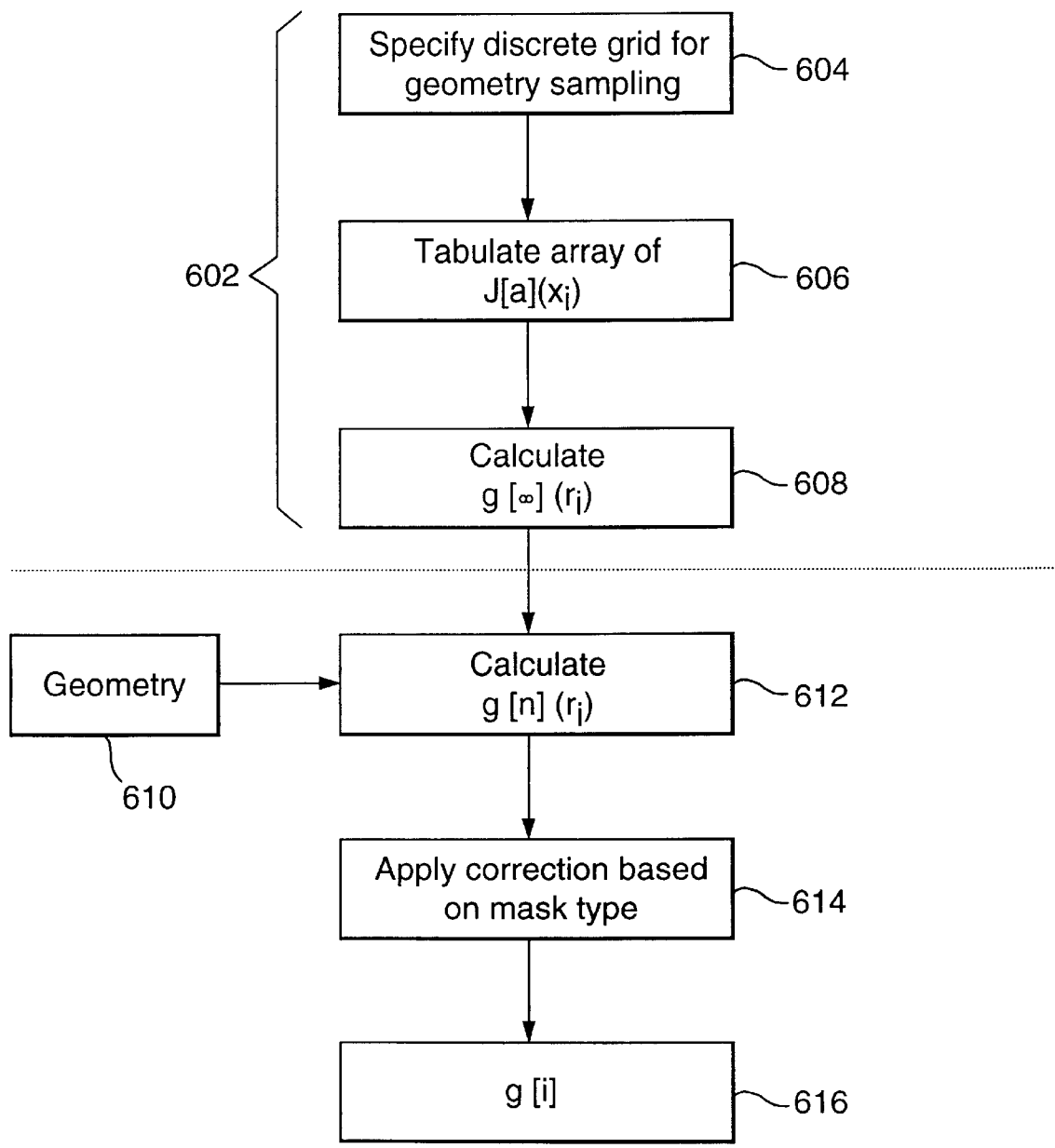
FIG. 6 illustrates an exemplary method for generating a vector in accordance with the present invention.

As relating to FIG. 6:
Point Decomposition
Define:

$$\langle r_w|g_i\rangle = \int dk \langle r_w|k\rangle\langle t|k\rangle\langle k|\eta_i\rangle \quad (114)$$

Then equation (78) can be expressed as:

$$I(r_w) = \sum_{ij} A_{ij}\langle r_w|g_i\rangle\langle g_j|r_w\rangle \quad (115)$$

$\langle g_i|r_w\rangle$ amounts to a convolution integral in real space:

$$\langle g_i|r\rangle = \int dr' \langle \eta_i|r-r'\rangle\langle t|r'\rangle^* \quad (116)$$

Decompose the mask transmission function into a disjoint set $$\langle t|r\rangle = \sum_p t_p 1_p(r) \quad (117)$$

Where $t_p$ is the complex transmission of the layout structure indicated by p and $1_p$ an indicator function of unit value over the support of p. For Manhattan geometry's $1_p$ is rectangular and may be factored as $$1_p = 1_{p_x} \cdot 1_{p_y} \quad (118)$$

and thus $$\langle g_i|r\rangle = \sum_p t_p^* \int dr' \langle \eta_i|r-r'\rangle 1_p(r) \quad (119)$$

Reduction of Field Integral

The above expressions reduce the mask transmission function to a summation over an indicator function $1_p$. Furthermore, for Manhattan geometry's, this indicator function factors into the Cartesian product $1_p = 1_{p_x} \cdot 1_{p_y}$. The next step is to simplify the integration in equation (117) utilizing the above reduction of the mask transmission function.

Factorization of the indicator function is matched by the choice of the spectral representation as discussed above with respect to basis set decomposition. The basis $\eta_i$ itself also factors into a Cartesian product $\eta_n = \eta_{n_x}^x \cdot \eta_{n_y}^y$. This permits decomposition of the two-demensional field integral of equation (117) into a product of two one-dimensional field integrals. Define:

$$I_{n_x}(dp_x^0, dp_x^1) := \int dx' \langle \eta_{n_x}^x|x-x'\rangle\langle 1_{p_x}|x'\rangle \quad (120)$$

$$= \int_{p_{x,0}}^{p_{x,1}} dx' \langle \eta_{n_x}^x|x-x'\rangle \quad (121)$$

$$= \int_{x-p_{x,0}}^{x-p_{x,1}} dx'' \langle \eta_{n_x}^x|x''\rangle \quad (122)$$

Where $$dp_x^0 := x - p_{x,0} \text{ lower boundary} \quad (123)$$

$$dp_x^1 := x - p_{x,1} \text{ upper boundary} \quad (124)$$

Using the Gamma-function factorization as discussed above with respect to the spectral basis, the above integration may be reduced to a recurrence over the semi-indefinite integrals $J_a(x)$ via equations (4), (9) and (10).

The above expression equation (117) then simplifies to:

$$\langle g_n|r\rangle = \sum_p t_p^* I_{n_x}(dp_x^0, dp_x^1)\cdot I_{n_y}(dp_y^0, dp_y^1) \quad (125)$$

A particular advantage of this representation follows when several layout features line up along a Cartesian dimension. Assume for example $q \in \Omega_1$ to be a subset of features that are vertically stacked up and have identical transmission $t_{\Omega_i}$. Then for all q the values of $q_{x,0} = c_0$ and $q_{x,1} = c_1$ are constant. The above expression then reduces to:

$$\langle g_n^{\Omega_i}|r\rangle = t_{\Omega_i}^* 1_{n_x}(dc_x^0, dc_x^1) \sum_{q \in \Omega_i} 1_{n_y}(dq_y^0, dq_y^1) \quad (126)$$

Intensity Calibration

For a fully transparent mask, $\Sigma_p 1_p(r) = 1$, $t_p = 1$ and equation (117) yields:

$$\langle g_i^\infty|r\rangle = \int dr' \langle \eta_i|r-r'\rangle \quad (127)$$

$$= I_{n_x}^x(-\infty, \infty) I_{n_y}^y(-\infty, \infty) \quad (128)$$

Dark Field Reticle (binary)

A binary darkfield mask has no background transmission while features have a transmission of 1. For Manhattan geometry features factor according to:

$$1_p = 1_{p_x} \cdot 1_{p_y} \quad (129)$$

Clear Field Reticle (binary)

For a binary clear field mask features have zero transmission ($0_p$) while the background has unit transmission. Note that $$\sum_p 1_p + \sum_{p'} 0_{p'} = 1 \quad (130)$$

Thus:

$$\langle g_i^{clear}|r\rangle = \langle g_i^\infty|r\rangle - \langle g_i^{dark}|r\rangle \quad (131)$$

Clear Field Mask (binary attenuated phase shift)

For an attenuated phase shift mask with 180° phase shift and attenuation factor α, the transmission of features is (−α) while the background transmission is +1. Thus $$\langle t|r\rangle = \sum_p 1_p^+(r) - a\sum_{p'} 1_{p'}^- \tag{132}$$

Note again that $1_p^+$ and $1_p^-$ completely cover the simulation domain:

$$\sum_p 1_p^+ + \sum_{p'} 1_{p'}^- = 1 \tag{133}$$

Thus $$\langle t|r\rangle = 1 - \sum_{p'} 1_{p'}^- - a\sum_{p'} 1_{p'}^- \tag{134}$$

$$= 1 - (a+1)\sum_{p'} 1_{p'}^- \tag{135}$$

Clear Field Reticle (ternary attenuated phase shift)

A ternary attPSM clear field reticle consists of three transmission domains: a 0° phase fully transmissive clear field region $1_p^+$, a 180° phase shifted region $1_p^-$ with transmission α, and a chrome blocking region $0_p$. A full partition of the mask area follows by the disjoint union of all three domains:

$$\sum_p 1_p^+ + \sum_{p'} 1_{p'}^- + \sum_q 0_q = 1 \tag{136}$$

The mask transmission function can be expressed as $$\langle t|r\rangle = \sum_p 1_p^+(r) - a\sum_{p'} 1_{p'}^- \tag{137}$$

$$= 1 - \sum_{p'} 1_{p'}^- - a\sum_{p'} 1_{p'}^- - \sum_q 0_q \tag{138}$$

$$= 1 - (a+1)\sum_{p'} 1_{p'}^- - \sum_q 0_q \tag{139}$$

The coherent field vector follows as $$\langle g_i^{cattsm}|r\rangle = \langle g_i^\infty|r\rangle - (\alpha+1)\langle g_i^{psm}|r\rangle - \langle g_i^{chrome}|r\rangle \tag{140}$$

Dark Field Reticle (ternary attenuated phase shift)

The domain partition of a ternary attPSM darkfield mask is identical to the domain partition of a ternary attPSM clearfield mask. The mask transmission function however is expressed in terms of $$1_p^+ \text{ and } 1_p^-:$$

$$\langle t/r\rangle = \sum_p 1_p^+(r) - a\sum_{p'} 1_{p'}^- \tag{141}$$

and thus the coherent field vectors follows as:

$$\langle g_i^{dattpsmic}|r\rangle = \langle g_i^+|r\rangle - \alpha\langle g_i^-|r\rangle \tag{142}$$

For an attPSM contact mask, the number of rectangles can be reduced through a different linear combination of $1^+$ and $1^-$. For a contact at index p define an 'outer frame region' $1^f$ that includes both the 0° and the 180° region as:

$$1_p^f = 1_p^+ + 1_p^- \tag{143}$$

the mask transmission function then follows as $$\langle t|r\rangle = \sum_p 1_p^+(r) - a1_p^- \tag{144}$$

$$= \sum_p 1_p^+(r) - a(1_p^f - 1_p^+) \tag{145}$$

$$= \sum_p (1+a)1_p^+(r) - a1_p^f \tag{146}$$

the coherent field vector can then be expressed as $$\langle g_i^{dattpsm}|r\rangle = (1+\alpha)\langle g_i^+|r\rangle - \alpha\langle g_i^f|r\rangle \tag{147}$$

Fast Implementation of Zero and OPD Model

The present invention provides an efficient method for calculating orthogonal pupil projections in the zero-defocused models, as illustrated in FIG. 10. Equation (92) is used to calculate an integral over the circular pupil aperture in (x,y) space. As illustrated in FIG. 10, the center of the aperture is shifted by S_$_s$. The method for performing the algorithm as illustrated in FIG. 10 is as follows. First is an angular step-size of 45°, wherein the point at the circle arc intersecting a ray emanating from the center is located. Next is to find the three mirror points, across the center and across the x and y axis through the center of the circle. These points are connected to form the rectangle $B_0$. Then the contribution of $B_0$ to p[a] according to the equations (95) and (17) is determined.

The following steps are then performed until the resulting rectangle becomes smaller than a discrete increment of the pupil grid. The angular step-size is reduced by half. Again, the point at the circle arc intersecting a ray emanating from the center at the current angle is determined. Again the symmetrical point is determined and the new set of rectangles is determined. Then the contribution of the new rectangles to p[a] according to the equations (95) and (17) is determined.

The method of calculating the area within the pupil as described with reference to FIG. 10, is much more efficient than the prior art system of FIG. 3. This is because in the method of FIG. 10, every discrete portion of the pupil is not calculated, thus a large amount of calculation time is saved. Specifically, the method of FIG. 10 uses a smaller number of rectangles to approximate a circular pupil shape.

Step S408 will now be further described with respect to FIG. 6. The initialization step S602 comprises three steps, S604, S606, and S608. At step S604 a discrete grid of the mask is specified for the geometric sampling. Methods for performing this step are known in the art. Step S606, however, is performed contrary to that of the prior art.

As opposed to arranging the data of the geometry for discrete sampling points on the grind of the mask as in the prior art systems, the present invention tabulates a one-dimensional array. In other words, the prior art method uses a one-dimensional array for the spectral indices and a two-dimensional array for the geometrical indices, thereby resulting in an array of two-dimensional tables. On the other hand, the method of the present invention uses a one-dimensional array for the spectral indices and a one-dimensional array for the geometrical indices, thereby resulting in an array of one-dimensional tables.

Specifically, an array of seed-elements for the spectral basis of each discrete point within a mask grid corresponding to the sample area is tabulated. Each seed-element is an incomplete gamma function J[a], such as is described above with respect to equation (11) and equation (10). The final initialization step S608 calculates the clear-field exposure reference and saves the value for subsequent exposure dose calibration with equation (128) and equation (9).

Step S610 will now be described in more detail. In order for an aerial image of a mask pattern to be simulated, the geometry of the respective mask must be decomposed into non-overlapping rectangles. As further illustrated in FIG. 8, item 800 is a predetermined proximity window containing an image of item 802, a sample mask comprising a plurality of sample features 804–808. Each feature is decomposed into non-overlapping rectangles. For example, feature 804 is decomposed into non-overlapping rectangles 810 and 812.

A circular proximity window of radius $r_{1,prox}$ may be defined as the domain for which the normalized edge variation of the zero-order basis $\langle g_0|r\rangle$ remains larger than or equal to $\epsilon_{acc}$. The boundary of this domain follows as:

$$\epsilon_{acc}(r_{1,prox}) := \frac{\langle \eta_0^x | r_{1,prox}\rangle}{\langle \eta_0^x | r = 0\rangle} = e^{-\alpha^2 r_{1,prox}^2/2} \quad (148)$$

Thus $$r_{1,prox} = \frac{\sqrt{-2\ln\epsilon_{acc}}}{\alpha} \quad (149)$$

Figure 8:
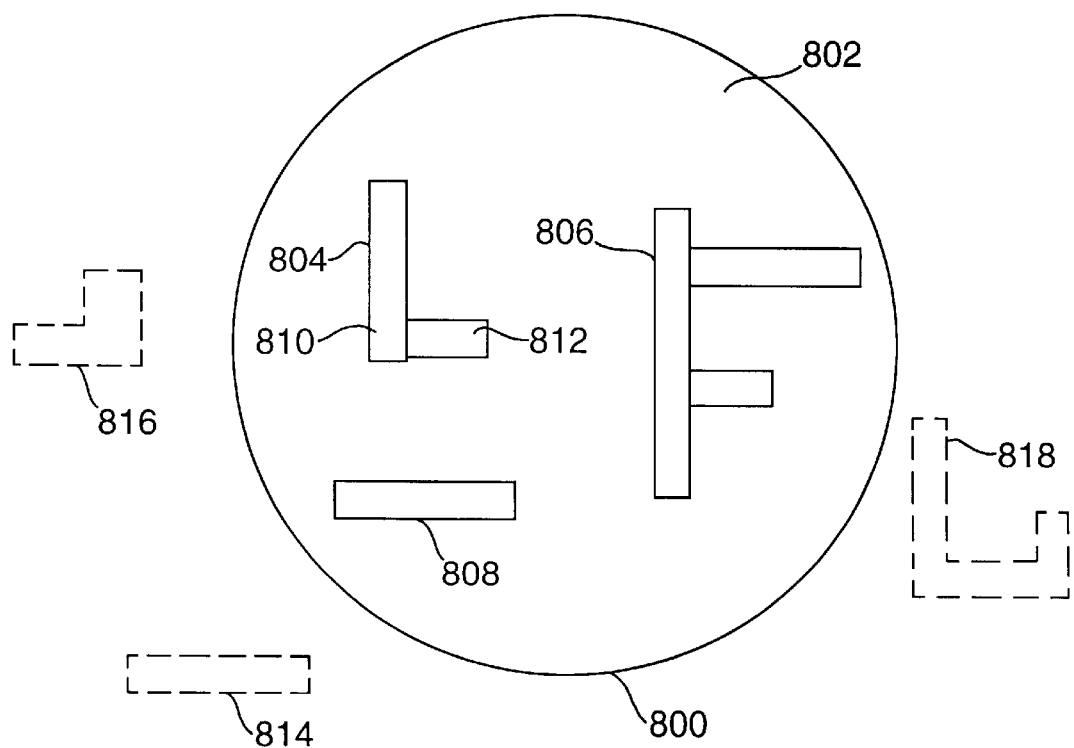
FIG. 8 illustrates an exemplary mask plane used in conjunction with the present invention.

In essence, the proximity window defines the set of all rectangles that affect the sampled area. Specifically, in this example, as illustrated in FIG. 8, features 814–818 do not have an affect on the aerial image of features 804–808. Therefore, features 814–818 are not within the proximity window.

Step S612 will now be described in more detail. Once the features within the sampling window have been decomposed into non-overlapping rectangles, the corresponding orthogonal projections of the features of the mask onto the basis set are calculated in accordance with equation (125) and equation (9).

Step S614 will now be described in more detail. Once the orthogonal projections have been calculated in step S612, corrections may need to be applied, for example, depending on the mask. If the mask is a clear field mask, then equation (131) may be used to correct the orthogonal projections. Further, if the mask is an attenuated phase-shift mask, then equation (140) may be used to correct the orthogonal projections. Finally, if the mask is a ternary attenuated phase-shift mask, then equation (142) may be used to correct the orthogonal projections. Once the corrections have been applied in step S614, the final corrected orthogonal projection of the mask transmission function g[i] is attained.

Intensity Summation

Figure 9:
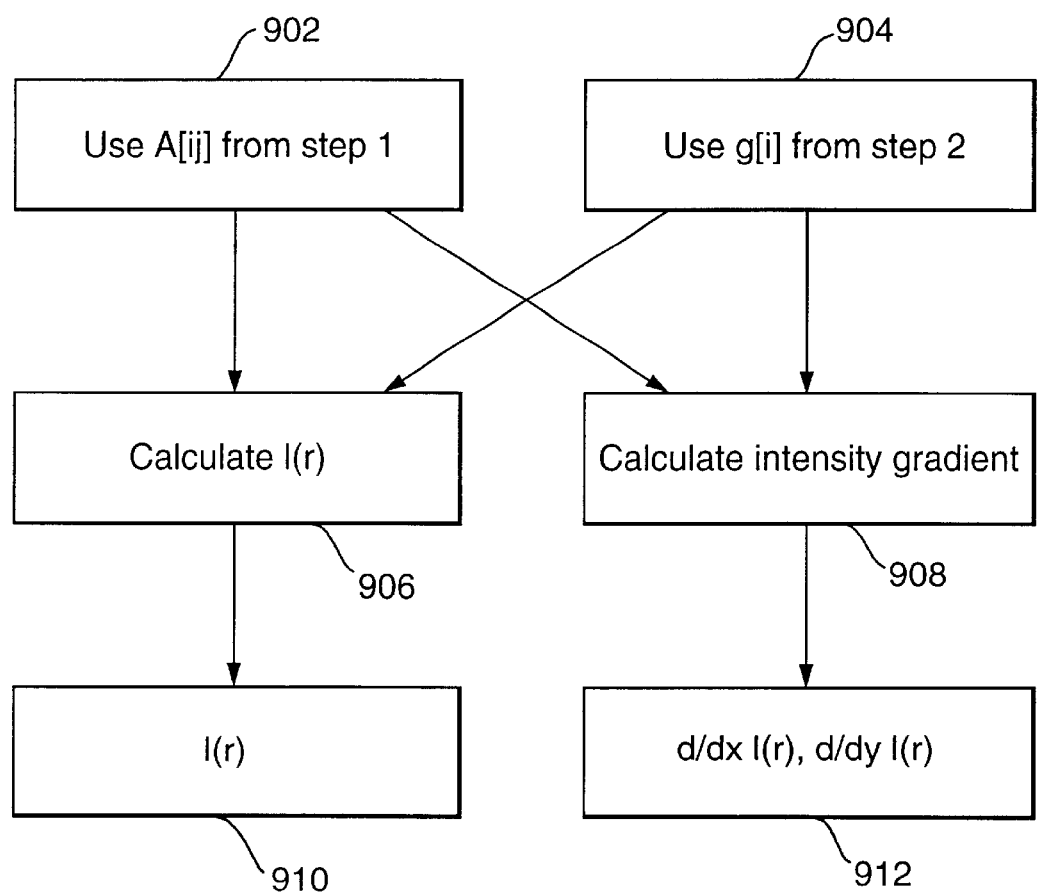
FIG. 9 illustrates an exemplary method for calculating an intensity profile and intensity gradient in accordance with the present invention.

Returning back to FIG. 4, once steps S404 and S408 have been performed, the image intensity distribution may be calculated at step S410. Step S410 will now be further explained with respect to FIG. 9. As illustrated in FIG. 9, at step S906, the A[ij] from step S902 is multiplied with the g[r] from step S904, in a bilinear form. This calculation provides the image intensity I(r) at point r. Furthermore, the intensity gradient at point r may be calculated at step S908. As illustrated in step S912, the intensity gradient may be measured with respect to the gradient in either the x or y coordinate axis.

Specifically, the image intensity I(r) at a particular sampling point, such as in step S906, can then be calculated as $$I(r) = \sum_{nm} \langle r|g_n\rangle A_{nm}\langle g_m|r\rangle \quad (150)$$

$$\partial_i I(r) = 2\mathrm{Re}\sum_{nm} A_{nm}\langle r|g_n\rangle\left(\frac{m_i}{2}\langle g_{[m_i-1_i]}|r\rangle - \langle g_{[m_i+1_i]}|r\rangle\right) \quad (151)$$

A numerical implementation may take advantage of the hermiticity of $A_{nm}$. The basis $\eta_1(r)$ is real. For binary masks, as well as 180° phase shift masks, $t_p$ is additionally real. Thus, the number of summation terms may be cut approximately in half:

$$I(r) = \sum_n A_{nn}\langle r|g_n\rangle\langle g_n|r\rangle + \sum_{n>m} 2(\mathrm{Re}\{A_{nm}\})\langle r|g_n\rangle\langle g_m|r\rangle \quad (152)$$

Dose Calibration

For a computational implementation, a calibration may be used against a clear field area for absolute exposure calculations. For example, using equation (128), the intensity of the clear-field exposed area then follows according to equation (150) as:

$$I^\infty = \sum_{ij} A_{ij}\langle r|g_i^\infty\rangle\langle g_j^\infty|r\rangle \quad (153)$$

Therefore, given an exposure dose D, the local intensity sampled at point r can then be calculated as:

$$D(r) = \frac{D}{I^\infty}\sum_{ij} A_{ij}\langle r|g_i\rangle\langle g_j|r\rangle \quad (154)$$

Equation (150) calculates I, which is the intensity calculated by the non-normalized algorithm for 100% exposure. Therefore, in order to calibrate the systems to give an exposure dose value D as specified by the user, a prefactor of $D/I^\infty$ is applied in step S906.

The system and method of the present invention may be incorporated into many applications. Non-limiting examples include: core simulation engine as part of an Model OPC calculation; simulation engine for predicting and optimizing fabrication parameters, such as NA, illumination, etc., for drawn layout features; simulation engine for predicting and optimizing geometric assist features, such as serifs, scattering bars, etc, to enhance the printability and yield of drawn layout features; simulation engine to predict the printing of defects on a mask for a specified fabrication process; and simulation engine to predict and optimize the balance of lens aberration components to optimize the printability and yield of drawn layout features.

Although specific reference may be made in the text to the use of lithographic projection apparatus in the manufacture of integrated circuits, it should be explicitly understood that such apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciated that, in the context of such alternative applications, any use of the terms "reticle" or "wafer" in this text should be considered as being replaced by the more general terms "mask" or "substrate", respectively.

Furthermore, although this text has concentrated on lithographic apparatus and methods whereby a mask is used to pattern the radiation beam entering the projection system, it should be noted that the invention presented here should be seen in the broader context of lithographic apparatus and methods employing generic "patterning means" to pattern the said radiation beam. The term "patterning means" as here employed refers broadly to means that can be used to endow an incoming radiation beam with a patterned cross-section, corresponding to a pattern that is to be created in a target portion of the substrate; the term "light valve" has also been used in this context. Generally, the said pattern will correspond to a particular functional layer in a device being created in the target portion, such as an integrated circuit or other device. Besides a mask (whether transmissive or reflective) on a mask table, such patterning means include the following exemplary embodiments:

(1) A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. An alternative embodiment of a programmable mirror array employs a matrix arrangement of tiny mirrors, each of which can be individually tilted about an axis by applying a suitable localized electric field or by employing piezoelectric means. Once again, the mirrors are matrix-addressable, such that addressed mirrors will reflect an incoming radiation beam in a different direction to unaddressed mirrors; in this manner, the reflected beam is patterned according to the addressing pattern of the matrix-adressable mirrors. The required matrix addressing can be performed using suitable electronic/computer means. More information on mirror arrays as here referred to can be gleaned, for example, from U.S. Pat. Nos. 5,296,891 and 5,523,193, and PCT patent applications WO 98/38597 and WO 98/33096, which are incorporated herein by reference.

(2) A programmable LCD array. An example of such a construction is given in U.S. Pat. No. 5,229,872, which is incorporated herein by reference.

Any reference to the term "mask" in the Claims and/or Description should be interpreted as encompassing the term "patterning means" as hereabove described.

In summary, although certain specific embodiments of the present invention have been disclosed, the present invention may be embodied in other forms without departing from the spirit or essential characteristics thereof. The present embodiments are therefor to be considered in all respects as illustrative and not restrictive, the scope of the invention being indicated by the appended claims, and all changes that come within the meaning and range of equivalency of the claims are therefore intended to be embraced therein.

What is claimed is:

1. A method for simulating an aerial image projected from an optical system, said optical system including a pupil and a mask plane, the method comprising the steps of:

providing a mask to the mask plane;

obtaining parameters for said optical system;

calculating a kernel based on an orthogonal pupil projection of said parameters of said optical system onto a first basis set;

obtaining parameters of said mask;

calculating a vector based on an orthogonal mask projection of said parameters of said mask onto a second basis set;

calculating a field intensity distribution using said kernel and said vector, and obtaining aerial image data from said field intensity distribution.

2. The method of claim 1, wherein said parameters for said optical system include aberrations.

3. The method of claim 2, wherein said step of calculating a kernel corresponding to said parameters of said optical system includes the step of tabulating an array of incomplete gamma functions corresponding to respective points in said pupil of said optical system.

4. The method of claim 2, wherein said step of calculating a kernel corresponding to said parameters of said optical system further includes the step of tabulating an array of orthogonal pupil projection coefficients corresponding to respective points in said pupil of said optical system, wherein said optical system is in-focus.

5. The method of claim 2, wherein said step of calculating a kernel corresponding to said parameters of said optical system further includes the step of tabulating an array of orthogonal pupil projection coefficients corresponding to respective points in said pupil of said optical system, wherein said optical system is either not in-focus or has aberrations.

6. The method of claim 2, wherein said step of calculating a kernel corresponding to said parameters of said optical system further includes the step of tabulating an array of orthogonal pupil projection coefficients corresponding to respective points in said pupil of said optical system, wherein said optical system accounts for effects of photoactive compound diffusion in a resist layer present on a substrate onto which an image of the mask is to be projected.

7. The method of claim 1, wherein said step of calculating a kernel corresponding to said parameters of said optical system includes the step of tabulating an array of incomplete gamma functions corresponding to respective points in said pupil of said optical system.

8. The method of claim 1, wherein said step of calculating a kernel corresponding to said parameters of said optical system further includes the step of tabulating an array of orthogonal pupil projection coefficients corresponding to respective points in said pupil of said optical system, wherein said optical system is in-focus.

9. The method of claim 8, further comprising the step of combining sample weights of an illuminator profile of said optical system with said array of orthogonal pupil projection coefficients.

10. The method of claim 1, wherein said step of calculating a kernel corresponding to said parameters of said optical system further includes the step of tabulating an array of orthogonal pupil projection coefficients corresponding to respective points in said pupil of said optical system, wherein said optical system is either not in-focus or has aberrations.

11. The method of claim 10, further comprising the step of combining sample weights of an illuminator profile of said optical system with said array of orthogonal pupil projection coefficients.

12. The method of claim 1, wherein said step of calculating a kernel corresponding to said parameters of said optical system further includes the step of tabulating an array of orthogonal pupil projection coefficients corresponding to respective points in said pupil of said optical system, wherein said optical system accounts for effects of photoactive compound diffusion in a resist layer present on a substrate onto which an image of the mask is to be projected.

13. The method of claim 12, further comprising the step of combining sample weights of an illuminator profile of said optical system with said array of orthogonal pupil projection coefficients.

14. The method of claim 1, wherein said step of calculating a vector corresponding to said parameters of said mask further includes the step of specifying a proximity window within said mask for geometric sampling.

15. The method of claim 1, wherein said step of calculating a vector corresponding to said parameters of said mask further includes the step of decomposing a geometric pattern of said mask into a disjoint set of rectangles and tabulating an array of projections of the rectangles within a proximity window.

16. The method of claim 15, wherein said step of calculating a vector corresponding to said parameters of said mask further includes the step of correcting the array of projections of the rectangles based on the type of mask.

17. A device manufacturing method comprising the steps of:

(a) providing a substrate that is at least partially covered by a layer of radiation-sensitive material;

(b) providing a mask that contains a pattern;

(c) using a projection beam of radiation and an optical system to project an image of at least part of the mask onto a target portion of the layer of radiation-sensitive material, whereby, prior to performing step (c), an aerial image to be projected from said optical system is simulated using a method comprising the steps of:

obtaining parameters for said optical system, which comprises a pupil and a mask plane;

calculating a kernel based on an orthogonal pupil projection of said parameters of said optical system onto a first basis set;

obtaining parameters of said mask, provided at said mask plane;

calculating a vector based on an orthogonal mask projection of said parameters of said mask onto a second basis set;

calculating a field intensity distribution using said kernel and said vector, and obtaining aerial image data from said field intensity distribution.

* * * * *